(12) United States Patent
Papworth Parkin

(10) Patent No.: US 7,598,555 B1
(45) Date of Patent: *Oct. 6, 2009

(54) MGO TUNNEL BARRIERS AND METHOD OF FORMATION

(75) Inventor: Stuart Stephen Papworth Parkin, San Jose, CA (US)

(73) Assignee: International Business Machines Corporation, Armonk, NY (US)

(*) Notice: Subject to any disclaimer, the term of this patent is extended or adjusted under 35 U.S.C. 154(b) by 641 days.

This patent is subject to a terminal disclaimer.

(21) Appl. No.: 10/973,954

(22) Filed: Oct. 25, 2004

Related U.S. Application Data

(63) Continuation of application No. 10/824,835, filed on Apr. 14, 2004, now abandoned, which is a continuation-in-part of application No. 10/646,246, filed on Aug. 22, 2003, now abandoned.

(51) Int. Cl.
  *H01L 27/22* (2006.01)
(52) U.S. Cl. .................... 257/295; 365/158
(58) Field of Classification Search ............. 365/158; 438/3; 257/295, E21.208
See application file for complete search history.

(56) References Cited

U.S. PATENT DOCUMENTS

| | | | |
|---|---|---|---|
| 5,390,061 A | 2/1995 | Nakatani et al. | |
| 5,465,185 A | 11/1995 | Heim et al. | |
| 5,640,343 A | 6/1997 | Gallagher et al. | |
| 5,650,958 A | 7/1997 | Gallagher et al. | |
| 5,729,410 A | 3/1998 | Fontana, Jr. et al. | |
| 5,764,567 A | 6/1998 | Parkin | |
| 5,841,692 A | 11/1998 | Gallagher et al. | |
| 5,862,022 A | 1/1999 | Noguchi et al. | |
| 5,936,293 A | 8/1999 | Parkin | |
| 6,153,320 A | 11/2000 | Parkin | |
| 6,172,859 B1 | 1/2001 | Watanabe et al. | |
| 6,226,160 B1 | 5/2001 | Gallagher et al. | |
| 6,249,407 B1 | 6/2001 | Aoshima et al. | |
| 6,347,049 B1 * | 2/2002 | Childress et al. | ............ 365/173 |
| 6,359,289 B1 | 3/2002 | Parkin | |
| 6,388,268 B1 | 5/2002 | Kim et al. | |

(Continued)

FOREIGN PATENT DOCUMENTS

JP 2000 322714 11/2000

(Continued)

OTHER PUBLICATIONS

Mitani et al, "Fe/MgO/FeCo(100) epitaxial . . . plasma oxidation", J.Appl.Phys. vol. 93, No. 10, May 2003, pp. 8041-8043.*

(Continued)

*Primary Examiner*—George Fourson
(74) *Attorney, Agent, or Firm*—Daniel E. Johnson

(57) ABSTRACT

MgO tunnel barriers are formed by depositing a thin layer of Mg on a suitable underlayer, and then directing oxygen and additional Mg towards the Mg layer. The oxygen reacts with the additional Mg and the Mg in the Mg layer to form a MgO tunnel barrier that enjoys excellent tunneling characteristics. The MgO tunnel barriers so formed may be used in magnetic tunnel junctions having tunneling magnetoresistance (TMR) values of greater than 100%. The highest TMR values are observed for junctions that have been annealed and that have a (100) crystallographic orientation.

42 Claims, 15 Drawing Sheets

U.S. PATENT DOCUMENTS

| | | | |
|---|---|---|---|
| 6,392,281 | B1 | 5/2002 | Tsuge |
| 6,429,497 | B1 | 8/2002 | Nickel |
| 6,535,365 | B1 | 3/2003 | Lukaszew et al. |
| 6,674,617 | B2* | 1/2004 | Gill ..................... 360/324.12 |
| 6,687,099 | B2 | 2/2004 | Nakatani et al. |
| 6,767,655 | B2 | 7/2004 | Hiramoto et al. |
| 6,791,792 | B2 | 9/2004 | Takahashi |
| 6,839,206 | B2* | 1/2005 | Saito et al. ............... 360/324.2 |
| 6,841,395 | B2 | 1/2005 | Linn et al. |
| 6,963,096 | B2 | 11/2005 | Schmidt et al. |
| 7,195,945 | B1* | 3/2007 | Edelstein et al. .............. 438/48 |
| 7,212,385 | B2 | 5/2007 | Hayakawa |
| 7,220,498 | B2* | 5/2007 | Nagahama et al. ........ 428/811.1 |
| 7,252,852 | B1* | 8/2007 | Parkin ........................ 427/131 |
| 7,270,896 | B2* | 9/2007 | Parkin ..................... 428/811.1 |
| 7,274,080 | B1* | 9/2007 | Parkin ........................ 257/421 |
| 7,276,384 | B2 | 10/2007 | Parkin et al. |
| 7,300,711 | B2* | 11/2007 | Parkin ..................... 428/811.1 |
| 7,345,855 | B2 | 3/2008 | Parkin |
| 7,349,187 | B2 | 3/2008 | Parkin |
| 7,443,639 | B2 | 10/2008 | Parkin |
| 2002/0006020 | A1 | 1/2002 | Hasegawa |
| 2002/0034094 | A1* | 3/2002 | Saito et al. ................. 365/158 |
| 2002/0076940 | A1 | 6/2002 | Hibino |
| 2002/0097534 | A1 | 7/2002 | Sun et al. |
| 2002/0097535 | A1 | 7/2002 | Ito et al. |
| 2002/0097537 | A1 | 7/2002 | Shimazawa |
| 2002/0114112 | A1 | 8/2002 | Nakashio et al. |
| 2002/0159203 | A1 | 10/2002 | Saito et al. |
| 2002/0163764 | A1 | 11/2002 | Nakazawa et al. |
| 2002/0164828 | A1 | 11/2002 | Ishiwata et al. |
| 2002/0191354 | A1 | 12/2002 | Yoshikawa et al. |
| 2002/0191355 | A1 | 12/2002 | Hiramoto et al. |
| 2003/0008416 | A1 | 1/2003 | Shimura et al. |
| 2003/0035249 | A1 | 2/2003 | Ho et al. |
| 2003/0058685 | A1 | 3/2003 | Tran et al. |
| 2003/0128483 | A1 | 7/2003 | Kamijo |
| 2003/0157373 | A1 | 8/2003 | Kirino et al. |
| 2003/0169542 | A1 | 9/2003 | Gill |
| 2003/0179071 | A1 | 9/2003 | Hiramoto et al. |
| 2004/0144995 | A1 | 7/2004 | Nagahama et al. |
| 2004/0207961 | A1 | 10/2004 | Ichimura et al. |
| 2004/0234815 | A1 | 11/2004 | Drewes |
| 2005/0094327 | A1 | 5/2005 | Okuno et al. |
| 2006/0164759 | A1 | 7/2006 | Okada et al. |
| 2007/0111332 | A1* | 5/2007 | Zhao et al. ...................... 438/3 |
| 2007/0154740 | A1 | 7/2007 | Yuasa et al. |
| 2007/0259213 | A1 | 11/2007 | Hashimoto et al. |
| 2007/0274193 | A1* | 11/2007 | Akiyama et al. ............ 369/126 |
| 2007/0297218 | A1* | 12/2007 | Abraham et al. ............ 365/158 |
| 2008/0138660 | A1 | 6/2008 | Parkin |
| 2008/0145952 | A1 | 6/2008 | Parkin |
| 2008/0182015 | A1 | 7/2008 | Parkin |
| 2008/0182342 | A1 | 7/2008 | Parkin |
| 2008/0291584 | A1 | 11/2008 | Parkin |

FOREIGN PATENT DOCUMENTS

| | | |
|---|---|---|
| WO | 02/075344 A2 | 9/2002 |
| WO | 02/099905 A1 | 12/2002 |

OTHER PUBLICATIONS

Hosotani et al, "Effect of Interface Buffer Layer on the Reliability of Ultra-Thin MgO Magnetic Tunnel Junctions", IEEE 45th Annual International Reliability oPhysic Symposium, Phoenix, 2007, pp. 650-651.*

Faure-Vincent, J., et al, "High Tunnel Magnetoresistance in Epitaxial Fe/MgO/Fe Tunnel Junctions", App.Phys.Lett. vol. 82, No. 25, Jun. 2003, pp. 4507-4510.*

Wulfhekel, W., et al, "Single-crystal Magnetotunnel Junctions", Appl.Phys.Lett. vol. 78, No. 4, Jan. 2001, pp. 509-511.*

M. Julliere, "Tunneling Between Ferromagnetic Films", Physics Letters, vol. 54A, No. 3, Sep. 8, 1975, pp. 225-226.

R. Meservey et al., "Spin-Polarized Electron Tunneling", Physics Reports (Review Section of Physics Letters) vol. 238, No. 4, 1994, pp. 173-243.

J. S. Moodera et al., "Large Magnetoresistance at Room Temperature in Ferromagnetic Thin Film Tunnel Junctions", Physical Review Letters, vol. 74, No. 16, Apr. 17, 1995, pp. 3273-3276.

T. Miyazaki et al., "Giant magnetic tunneling effect in Fe/Al2O3/Fe junction", Journal of Magnetism and Magnetic Materials, vol. 139, 1995, pp. L231-L234.

D. J. Keavney et al., "Perpendicular conductance and magnetic coupling in epitaxial Fe/MgO/Fe(100) trilayers", J. Appl. Phys., vol. 81, No. 2, Jan. 15, 1997, pp. 795-798.

P. K. Wong et al., "High conductance magnetoresistive tunnel junctions with multiply oxidized barrier", Journal of Applied Physics, vol. 83, No. 11, Jun. 1, 1998, pp. 6697-6699.

E. Y. Tsymbal et al., "Spin-polarized electron tunneling across a disordered insulator", Physical Review B, vol. 58, No. 1, Jul. 1, 1998-I, pp. 432-437.

S.S.P. Parkin et al., "Exchange-biased magnetic tunnel junctions and application to nonvolatile magnetic random access memory (invited)", J. of Applied Physics, vol. 85, No. 8 Apr. 15, 1999, pp. 5828-5833.

K. Aoshima et al., "Thermal deterioration mechanism of CoFeB/PdPtMn Spin valves", J. of Applied Physics, vol. 85, No. 8, Apr. 15, 1999, pp. 5042-5044.

Ph. Mavropoulos et al., "Complex Band Structure and Tunneling through Ferromagnet/Insulator/Ferromagnet Junctions", Phys. Review Letters, vol. 85, No. 5, Jul. 31, 2000, pp. 1088-1091.

D. J. Monsma et al., "Spin polarization of tunneling current from ferromagnet/Al2O3 Interfaces using copper-doped aluminum superconducting films", Applied Physics Letters, vol. 77, No. 5, Jul. 31, 2000, pp. 720-722.

X.-F. Han et al., "Fabrication of high-magnetoresistance tunnel junctions using Co75Fe25 ferromagnetic electrodes", Applied Physics Letters, vol. 77, No. 2, Jul. 10, 2000, pp. 283-285.

H. Xi, "Annealing Effect on Exchange Bias in Ni81Fe19/Cr50Mn50 Bilayers", IEEE Transactions on Magnetics, vol. 36, No. 5, Sep. 2000, pp. 2644-2646.

S. Cardoso et al., "High thermal stability tunnel junctions", Journal of Applied Physics, vol. 87, No. 9, May 1, 2000, pp. 6058-6060.

S. Cardoso et al., "Spin-tunnel-junction thermal stability and interface interdiffusion above 300 C", Applied Physics Letters, vol. 76, No. 5, Jan. 31, 2000, pp. 610-612.

M. Takiguchi et al., "Thermal degradation of spin valve multilayers caused by Mn Migration", Journal of Applied Physics, vol. 87, No. 5, Mar. 1, 2000, pp. 2469-2471.

H.L. Meyerheim et al., "Geometrical and Compositional Structure at Metal-Oxide Interfaces: MgO on Fe(001)", Physical Review Letters, vol. 87, No. 7, Aug. 13, 2001, pp. 076102-1 through 076102-4.

M. Bowen et al., "Large magnetoresistance in Fe/MgO/FeCo(001) epitaxial tunnel junctions on GaAs(001)", Applied Physics Letters, vol. 79, No. 11, Sep. 10, 2001, pp. 1655-1657.

W. Wulfhekel et al., "Single-crystal magnetotunnel junctions", Applied Physics Letters, vol. 78, No. 4, Jan. 22, 2001, pp. 509-511.

W. H. Butler et al., "Spin-dpendent tunneling conductance of Fe/MgO/Fe sandwiches", Physical Review B, vol. 63, Jan. 8, 2001, pp. 054416-1 through 054416-12.

Y. Kim et al., "Magnetoresistance and interlayer diffusion in PtMn spin valves upon postdeposition annealing", J. of Applied Physics, vol. 89, No. 11, Jun. 1, 2001, pp. 6907-6909.

S. Yuasa et al., "Spin-Polarized Resonant Tunneling in Magnetic Tunnel Junctions", Science, vol. 297, Jul. 12, 2002, pp. 234-237.

E. Popova et al., "Epitaxial MgO layer for low-resistance and coupling-free magnetic tunnel junctions", Applied Physics Letters, vol. 81, No. 6, Aug. 5, 2002, pp. 1035-1037.

M. Tsunoda et al., "60% magnetoresistance at room temperature in Co-Fe/Al-O/Co-Fe tunnel junctions oxidized with Kr-O2 plasma", Appl. Physics Letters, vol. 80, No. 17, Apr. 29, 2002, pp. 3135-3137.

X.-G. Zhang et al., "Effects of the iron-oxide layer in Fe-FeO-MgO-Fe tunneling junctions", Physical Review B, vol. 68, 2003, pp. 092402-1 through 092402-4.

S. Mitani et al., "Fe/MgO/FeCo(100) epitaxial magnetic tunneljunctions prepared by using in situ plasma oxidation", Journal of Applied Physics, vol. 93, No. 10, May 15, 2003, pp. 8041-8043.

J. Faure-Vincent et al., "High tunnel magnetoresistance in epitaxial Fe/MgO/Fe tunnel junctions", Applied Physics Letters, vol. 82, No. 25, Jun. 23, 2003, pp. 4507-4509.

M. Zwierzycki et al., "Spin injection through an Fe/InAs interface", Physical Review B, vol. 67, 2003, pp. 092401-1 through 092401-4.

D. Smith et al., "Structural characterization of thin film ferromagnetic tunnel junctions", Journal of Applied Physics, vol. 83, No. 10, May 15, 1998, pp. 5154-5158.

J. Mathon et al., "Theory of tunneling magnetoresistance of an epitaxial Fe/MgO/Fe (001) junction", Physical Review B, vol. 63, pp. 220403-1 through 220403-4.

M. Klaua et al., "Growth, structure, electronic, and magnetic properties of MgO/Fe(001) bilayers and Fe/MgO/Fe(001) trilayers", Physical Review B, vol. 64, pp. 134411-1 through 134411-8.

Yuasa, "High Tunnel Magnetoresistance at Room Temperature in Fully Epitaxial Fe/MgO/Fe Tunnel Junctions due to Coherent Spin-Polarized Tunneling," Japanese Journal of Applied Physics, 2004, pp. L588-L590, vol. 43, No. 4B, The Japan Society of Applied Physics, Japan.

Motsnyi, "Electrical spin injection in a ferromagnet/tunnel barrier/semiconductor heterostructure," Applied Physics Letters, Jul. 8, 2002, pp. 265-267, vol. 81, No. 2, American Institute of Physics, USA.

Manago, "Spin-polarized light-emitting diode using metal/insulator/semiconductor structures," Applied Physics Letters, Jul. 22, 2002, pp. 694-696, vol. 81, No. 4, American Institute of Physics, USA.

Nishimura et al.; Magnetic tunnel junction device with perpendicular magnetization films for high-density magnetic random access memory; (J. App. Phys.,V91(8), Apr. 2002, pp. 5246-5249.

* cited by examiner

MGO TUNNEL BARRIERS AND METHOD OF FORMATION

This application is a continuation of Applicant's U.S. application Ser. No. 10/824,835 filed Apr. 14, 2004 now abandoned and entitled "MgO Tunnel Barriers and Method of Formation", which in turn is a continuation-in-part of Applicant's U.S. application Ser. No. 10/646,246 filed Aug. 22, 2003 now abandoned and entitled "MgO Tunnel Barriers and Method of Formation", both of which are hereby incorporated by reference.

The U.S. Government has a paid-up license in this invention and the right in limited circumstances to require the patent owner to license others on reasonable terms as provided for by the terms of contract MDA972-99-C-0009 awarded by DARPA.

TECHNICAL FIELD

The invention relates to magnetic tunnel junction (MTJ) magnetoresistive (MR) devices for use as magnetic field sensors such as read heads for reading magnetically recorded data, as memory cells in nonvolatile magnetic random access memory (MRAM) cells, and for magnetic logic and spintronic applications. More particularly, this invention relates to a method of forming a MgO tunnel barrier to allow for MTJ devices with significantly improved magnetoresistance.

BACKGROUND OF THE INVENTION

The basic component of a magnetic tunnel junction is a sandwich of two thin ferromagnetic and/or ferrimagnetic layers separated by a very thin insulating layer through which electrons can tunnel. The tunneling current is typically higher when the magnetic moments of the ferromagnetic (F) layers are parallel and lower when the magnetic moments of the two ferromagnetic layers are anti-parallel. The change in conductance for these two magnetic states can be described as a magneto-resistance. Here the tunneling magnetoresistance (TMR) of the MTJ is defined as $(R_{AP}-R_P)/R_P$ where $R_P$ and $R_{AP}$ are the resistance of the MTJ for parallel and anti-parallel alignment of the ferromagnetic layers, respectively. MTJ devices have been proposed as memory cells for nonvolatile solid state memory and as external magnetic field sensors, such as TMR read sensors for heads for magnetic recording systems. For a memory cell application, one of the ferromagnetic layers in the MTJ has its magnetic moment fixed or pinned, so that its magnetic moment is unaffected by the presence of the magnetic fields applied to the device during its operation. The other ferromagnetic layer in the sandwich is the free or sensing layer, whose moment responds to magnetic fields applied during operation of the device. In the quiescent state, in the absence of any applied magnetic field within the memory cell, the sensing layer magnetic moment is designed to be either parallel (P) or anti-parallel (AP) to the magnetic moment of the pinned ferromagnetic layer. For a TMR field sensor for read head applications, one of the ferromagnetic layers has its magnetic moment fixed or pinned so as to be generally perpendicular to the magnetic moment of the free or sensing ferromagnetic layer in the absence of an external magnetic field. The use of an MTJ device as a memory cell in an MRAM array is described in U.S. Pat. No. 5,640,343. The use of an MTJ device as a MR read head has been described in U.S. Pat. Nos. 5,390,061; 5,650,958; 5,729,410 and 5,764,567.

FIG. 1 illustrates a cross-section of a conventional prior-art MTJ device. The MTJ 100 includes a bottom "fixed" ferromagnetic (F) layer 18, an insulating tunnel barrier layer 24, and a top "free" ferromagnetic layer 34. The MTJ 100 has bottom and top electrical leads 12 and 36, respectively, with the bottom lead being formed on a suitable substrate 11, such as a silicon oxide layer. The ferromagnetic layer 18 is called the fixed layer because its magnetic moment is prevented from rotating in the presence of an applied magnetic field in the desired range of interest for the MTJ device, e.g., the magnetic field caused by the write current applied to the memory cell from the read/write circuitry of the MRAM or the magnetic field from the recorded magnetic layer in a magnetic recording disk. The magnetic moment of the ferromagnetic layer 18, whose direction is indicated by the arrow 90 in FIG. 1, can be fixed by forming it from a high coercivity magnetic material or by exchange coupling it to an antiferromagnetic layer 16. The magnetic moment of the free ferromagnetic layer 34 is not fixed, and is thus free to rotate in the presence of an applied magnetic field in the range of interest. In the absence of an applied magnetic field, the moments of the ferromagnetic layers 18 and 34 are aligned generally parallel (or anti-parallel) in an MTJ memory cell (as indicated by the double-headed arrow 80 in FIG. 1) and generally perpendicular in a MTJ magnetoresistive read head. The relative orientation of the magnetic moments of the ferromagnetic layers 18, 34 affects the tunneling current and thus the electrical resistance of the MTJ device. The bottom lead 12, the antiferromagnetic layer 16, and the fixed ferromagnetic layer 18 together may be regarded as constituting the lower electrode 10.

The basic concept of a magnetic tunnel junction was first realized in 1975 (M. Julliére, "*Tunneling between ferromagnetic films*", Phys. Lett. 54A, 225 (1975)) although the TMR was very small and observed only at low temperatures and for very small bias voltages. In 1995 significant TMR effects of about 10% were obtained at room temperature in MTJs with $Al_2O_3$ tunnel barriers by two different groups (J. S. Moodera et al., "*Large magnetoresistance at room temperature in ferromagnetic thin film tunnel junctions*", Phys. Rev. Lett. 74, 3273 (1995); and T. Miyazaki and N. Tezuka, "*Giant magnetic tunneling effect in Fe/$Al_2O_3$/Fe junction*", J. Magn. Magn. Mat. 139, L231 (1995)). Subsequently, S. S. P. Parkin et al. ("*Exchange-biased Magnetic Tunnel Junctions and Application to Non-Volatile Magnetic Random Access Memory*", J. Appl. Phys. 85, 5828 (1999)) obtained effects as large as about 48-50% by optimizing the growth of the $Al_2O_3$ tunnel barrier, by optimizing the interface between the $Al_2O_3$ tunnel barrier and the ferromagnetic electrodes, and by carefully controlling the magnetic orientation of the ferromagnetic moments using concepts of magnetic engineering, in particular, exchange bias (see U.S. Pat. No. 5,650,958 titled "Magnetic tunnel junctions with controlled magnetic response" to W. J. Gallagher et al.) and an anti-parallel coupled pinned ferromagnetic layer (see U.S. Pat. No. 5,841,692 titled "Magnetic tunnel junction device with antiferromagnetically coupled pinned layer" to W. J. Gallagher et al.).

The magnetoresistance of MTJs using aluminum oxide tunneling barriers is limited to about 50% at room temperature (S. S. P. Parkin et al., "*Exchange-biased Magnetic Tunnel Junctions and Application to Non-Volatile Magnetic Random Access Memory*", J. Appl. Phys. 85, 5828 (1999); X.-F. Han et al., "*Fabrication of high-magnetoresistance tunnel junctions using $Co_{75}Fe_{25}$ ferromagnetic electrodes*", Appl. Phys. Lett. 77, 283 (2000)), although there have been reports of TMR values of up to about 58% at room temperature (M. Tsunoda et al., "*60% magnetoresistance at room temperature in Co—Fe/Al—O/Co—Fe tunnel junctions oxidized with Kr—O2 plasma*", Appl. Phys. Lett. 80, 3135 (2002)). The detailed structure and composition of the barrier and particularly the structure and composition of the interfaces between the barrier and the ferromagnetic electrodes clearly influences the magnitude of the TMR (as well as the resistance of the junctions). Usually the $Al_2O_3$ tunnel barrier is formed by first depositing a thin aluminum layer and then oxidizing this layer either by using an oxygen plasma or by oxidation in oxygen or air. Incomplete or under-oxidation of the barrier may lead to "pin-holes" in the barrier which will usually result in a diminishment of the TMR. On the other hand, over-oxidation of the barrier or excess oxygen within the barrier or at the barrier surface will result in oxidation of the ferromagnetic electrodes which also usually results in decreased TMR. There have been a small number of reports of improved TMR by using special methods of forming $Al_2O_3$ tunnel barriers. For example, Tsunoda et al., "60% *magnetoresistance at room temperature in Co—Fe/Al—O/Co—Fe tunnel junctions oxidized with Kr—O2 plasma*", Appl. Phys. Lett. 80, 3135 (2002), assert that it is preferred to oxidize the Al layer by using a plasma formed from an inert gas-oxygen mixture where the inert gas is Kr or He. They argue that this method results in an improved barrier layer, because it has previously been shown that $SiO_2$ gate dielectric layers have improved properties (lower number of interface defect states) when formed by oxidation using inert gas-$O_2$ plasmas.

The tunnel magnetoresistance (TMR) of MTJs is also influenced by the ferromagnetic electrode. For electrodes formed from Ni—Fe, Co—Fe or Ni—Fe—Co alloys, it is now generally agreed that there is a surprisingly weak dependence of TMR on the composition of this alloy (S. S. P. Parkin et al., "*Exchange-biased Magnetic Tunnel Junctions and Application to Non-Volatile Magnetic Random Access Memory*", J. Appl. Phys. 85, 5828 (1999); D. J. Monsma and S. S. P. Parkin, "*Spin polarization of tunneling current from ferromagnet/$Al_2O_3$ interfaces using copper-doped aluminum superconducting films*", Appl. Phys. Lett. 77, 720 (2000)), but that the magnitude of the TMR is strongly influenced by the quality of the interface between the ferromagnetic electrode and the $Al_2O_3$ tunnel barrier. Once the interface structure is optimized, either by optimizing the growth or by post-growth annealing, for sufficiently thick $Al_2O_3$ tunnel barriers which give rise to resistance-area (RA) products exceeding ~100-500 $\Omega\mu m^2$, TMR values between 40 and 50% can be obtained for almost all of these ferromagnetic alloys. As the tunnel barrier thickness and the corresponding RA value are decreased below this value, it is generally found that the maximum TMR which can be obtained is reduced (see U.S. Pat. No. 6,226,160 titled "Small area magnetic tunnel junction devices with low resistance and high magnetoresistance" to W. J. Gallagher and S. S. P. Parkin, which is hereby incorporated by reference).

For applications of magnetic tunnel junctions for either magnetic recording heads or for non-volatile magnetic memory storage cells, high TMR values are needed for improving the performance of these devices. The speed of operation of the recording head or memory is related to the signal to noise ratio (SNR) provided by the MTJ—higher TMR values will lead to higher SNR values for otherwise the same resistance. Moreover, for memory applications, the larger the TMR, the greater is the variation in resistance of the MTJs from device to device which can be tolerated. Since the resistance of an MTJ depends exponentially on the thickness of the tunneling barrier, small variations in thickness can give rise to large changes in the resistance of the MTJ. Thus high TMR values can be used to mitigate inevitable variations in tunnel barrier thickness from device to device. The resistance of an MTJ device increases inversely with the area of the device. As the density of memory devices increases in the future, the thickness of the tunnel barrier will have to be reduced (for otherwise the same tunnel barrier material) to maintain an optimal resistance of the MTJ memory cell for matching to electronic circuits. Thus a given variation in thickness of the tunnel barrier (introduced by whatever process is used to fabricate the MTJ) will become an increasingly larger proportion of the reduced tunnel barrier thickness and so will likely give rise to larger variations in the resistance of the MTJ device.

The tunneling current in an MTJ is spin polarized, which means that the electrical current passing from one of the ferromagnetic layers is predominantly composed of electrons of one spin type (spin up or spin down, depending on the orientation of the magnetization of the ferromagnetic layer). The spin polarization P of the current can be inferred from a variety of different measurements. The measurement most relevant to magnetic tunneling is to measure the conductance as a function of bias voltage for junctions formed from a sandwich of the ferromagnetic material of interest and a superconducting counter electrode (R. Meservey and P. M. Tedrow, Phys. Rep. 238, 173 (1994)). These studies show that the spin polarization of the tunnel current measured in this way can be simply related to the TMR close to zero bias voltage as first proposed by Juliere (M. Julliére, Phys. Lett. 54A, 225 (1975)). In such a model P is defined as $(n_\uparrow - n_\downarrow)/(n_\uparrow + n_\downarrow)$, where $n_\uparrow$ and $n_\downarrow$ are the density of spin up and spin down states at the ferromagnet/insulator interface. By assuming that the tunnel current is comprised of two independent majority and minority spin currents and that these currents are related to the respective density of states of the majority and minority carriers in the opposing ferromagnetic electrodes, the TMR can be formulated by the relation TMR=$(R_{AP}-R_P)/R_P$=$2P_1P_2/(1-P_1P_2)$, where $R_{AP}$ and $R_P$ are the resistance of the MTJ for anti-parallel and parallel orientation of the ferromagnetic electrodes, respectively, and $P_1$ and $P_2$ are the spin polarization values of the two ferromagnetic electrodes. Experimentally, it is clear that the magnitude of the TMR is extremely sensitive to the nature of the interface between the tunneling barrier and the ferromagnetic electrode. By changing the properties of the interface layer, for example, by inserting very thin layers of non-magnetic metals between the ferromagnet and the insulator layers, the TMR can be dramatically altered. Based on such observations, most experimental data on magnetic tunneling have usually been interpreted by assuming that P is largely determined by the electronic structure of the ferromagnetic interface layer essentially independent of the tunnel barrier electronic structure.

Recently, it has been speculated that the electronic structure of the tunnel barrier may play a more important role than previously realized (W. H. Butler, X.-G. Zhang, T. C. Schulthess et al., Phys. Rev. B 63, 054416 (2001); and P. Mavropoulos, N. Papanikolaou, and P. H. Dederichs, Phys. Rev. Lett. 85, 1088 (2000)). In particular, the primary role of the tunnel barrier was previously assumed to be to determine the evanescent decay length of the electronic wave functions into the tunnel barrier region. Butler et al. and Mavropoulos et al. have argued that the evanescent decay length depends on both the momentum of the electrons transverse to the ferromagnet/insulator interface as well as the Bloch symmetry of these wave functions. Butler et al. have especially considered the case of Fe/MgO/Fe, since it has long been recognized that there is an almost perfect lattice match between the simple cubic structure of the MgO insulator and the body-centered cubic (bcc) structure of Fe for the (100) crystallographic orientation if the lattices are rotated by 45 degrees. Butler et al. find that for the (100) orientation there is a very slow decay into the MgO barrier of majority spin electron states with $\Delta_1$ symmetry for small transverse momentum. Thus, for parallel orientation of the ferromagnetic electrodes in an MTJ, these electronic states lead to a very high conductance across the tunnel barrier. Butler et al. calculate that the Fe/MgO/Fe system should exhibit TMR values of hundreds or even thousands of percent. Moreover, Butler et al. calculate that the TMR should have a very strong dependence on MgO tunnel barrier thickness, increasing by orders of magnitude as the MgO thickness is changed by a few atomic layers. Such speculations have led to numerous experimental studies to explore the possibility of high TMR in epitaxial (100) oriented Fe/MgO/Fe tunnel junctions. Note that early work by several groups on MTJs containing polycrystalline MgO tunnel barriers found no evidence for large TMR values.

Some of the first studies of Fe/MgO/Fe MTJs were those by Keavney et al. (D. J. Keavney, E. E. Fullerton, and S. D. Bader, J. Appl. Phys. 81, 795 (1997)) who prepared high quality epitaxial MgO tunnel barriers on Fe single crystal whiskers using molecular beam epitaxy (MBE) growth techniques in which the Fe and MgO layers were deposited by electron beam evaporation. Keavney et al. argued that the MgO incompletely wets the Fe underlayer leading to pin-holes in the MgO layer and, thus, to ferromagnetic coupling of the Fe layers through the MgO layer. The pin-holes through the tunnel barrier electrically shorted the MTJ so that no TMR was observed. These authors concluded that MgO was a very poor choice for a tunneling barrier in MTJs. Later Wulfhekel et al. (W. Wulfliekel, M. Klaua, D. Ullmann, et al., Appl. Phys. Lett. 78, 509 (2001)) prepared high quality epitaxial MgO tunnel barriers on Fe single-crystal whiskers using both molecular beam epitaxy (MBE) and pulsed laser deposition (PLD) growth techniques. This group concluded, by looking at tunneling through the MgO layer using scanning probe microscopy, that a significant portion of the electrical current tunneled through the MgO layer, although there were some local hot spots. The hot spots correspond to some sort of defect or pin-hole. However, although the crystalline quality of these films was very good, this group found no evidence for significant tunneling magnetoresistance in their samples.

The first report of significant tunneling magnetoresistance through epitaxially grown MgO tunnel barriers was by Bowen et al. (M. Bowen, V. Cros, F. Petroff, et al., Appl. Phys. Lett. 79, 1655 (2001)), who reported 60% TMR but at low temperatures (30K). However, at room temperature this group reported TMR values of only 27%, which is much lower than TMR values that have been obtained with conventional amorphous $Al_2O_3$ tunnel barriers. This group studied sandwiches of CoFe/MgO/Fe grown on GaAs(100) with MgO(100) buffer layers by a combination of sputtering (CoFe and Fe) and laser ablation (MgO). The MgO barrier was grown at 400° C., and the Fe and CoFe layers were deposited at room temperature, but the Fe layer was annealed at 400° C. after deposition and prior to deposition of the MgO layer on top of it. The $CO_{50}Fe_{50}$ layer was the top electrode and was presumably used to allow for different magnetic switching fields for the two ferromagnetic electrodes. This group studied TMR in junctions with very thick Fe and CoFe layers (~200 Å and 250 Å, respectively)—much too thick for useful applications because of the very large demagnetizing fields that would be produced by these thick layers. This group explored MgO layers in a range of thickness from 20 to 80 Å, and from cross-section transmission electron microscopy studies found good quality crystalline (100) oriented MgO layers for these thicknesses. Based on the predictions by Butler et al. that the TMR for epitaxial MgO tunnel barriers should increase strongly with MgO thickness, Bowen et al. argued that the small TMR values they observed might be increased for thicker MgO tunnel barriers, although they only included tunneling transport data for one MgO layer thickness.

Popova et al. (E. Popova, J. Faure-Vincent, C. Tiusan, et al., Appl. Phys. Lett. 81, 1035 (2002)) have published results on epitaxial 100 oriented Fe/MgO/Fe/Co MTJs deposited by MBE on MgO(100) substrates. This group prepared the Fe layers by evaporation from a Knudsen cell and the Co and MgO layers by electron beam evaporation. The first Fe layer was deposited at room temperature and then annealed at 450° C. after deposition and prior to deposition of the MgO barrier. This group reported modest values of TMR at room temperature of only ~15% for junctions with 10 Å thick MgO barriers, although the crystalline quality of the structures was very good with smooth and epitaxial Fe and MgO layers. This same group has recently published data on similar structures with thicker tunnel barriers (25 Å thick) in which TMR values of up to 67% were found at room temperature (J. Faure-Vincent, C. Tiusan, E. Jouguelet, et al., Appl. Phys. Lett. 82, 4507 (2003)). They argue that thick MgO tunnel barriers are needed to obtain these higher TMR values, even though the TMR they find is not significantly higher than that which has been observed in MTJs with $Al_2O_3$ tunnel barriers. Popova et al. also suggest that the modest TMR values they find, especially when compared to the theoretical predictions of Butler et al., may result from the formation of an FeO layer at the Fe/MgO interface during the deposition of MgO on the lower Fe electrode. The formation of an FeO layer was previously postulated by Meyerheim et al. (H. L. Meyerheim, R. Popescu, J. Kirschner, et al., Phys. Rev. Lett. 87, 076102 (2001)), who found evidence for a such a layer from detailed structural investigations using surface x-ray diffraction of the growth of MgO on single crystal Fe(001) substrates. Recently, X.-G. Zhang, W. H. Butler, and A. Bandyopadhyay (Phys. Rev. B 68, 092402 (2003)) have carried out calculations of the TMR for Fe/FeO/MgO/Fe junctions and have found that the presence of an FeO layer substantially reduces the predicted TMR values for this system.

Recently Mitani et al. (S. Mitani, T. Moriyama, and K. Takanashi, J. Appl. Phys. 93, 8041 (2003)) have also attempted to prepare epitaxial Fe/MgO/Fe tunnel junctions by growth on single crystalline MgO(100) substrates. Mitani et al. first deposited an Fe layer (200 Å thick) by electron beam deposition at room temperature with a subsequent post-deposition anneal at 200° C. They then deposited a MgO tunnel barrier by depositing a thin layer of Mg, plasma oxidizing this layer in an Ar—$O_2$ mixture, and then repeating this process several times to create the tunnel barrier. Subsequently they deposited a $CO_{50}Fe_{50}$ counter electrode on top of the MgO barrier to create the MTJ. Although this group was able to prepare high quality epitaxial tunnel junctions, these junctions showed poor TMR, with TMR values at low temperatures (4.2 K) of only 22.9%. The resistance of the tunnel junctions was found to decrease substantially with temperature, which Mitani et al. argued was due to poor quality MgO tunnel barriers with defects in the barrier, which resulted in hopping conductivity of the tunneling electrons through these defects.

In U.S. Pat. No. 6,392,281, Tsuge discloses a means of forming a magnetic tunnel junction formed from two ferromagnetic layers separated by an oxide tunnel barrier (e.g., $Al_2O_3$ or MgO) by first depositing the lower ferromagnetic electrode with or without a metal overlayer and then forming an oxide of the metal layer, if present, and the upper portion of the ferromagnetic layer by exposing these layers to ultra-pure oxygen. When the metal layer is not initially present, a metal layer is subsequently formed on top of the ferromagnetic oxide layer and is then subjected to oxidation by pure oxygen gas. Tsuge argues that a subsequent heat treatment will cause oxygen to diffuse from the ferromagnetic oxide layer into the metal oxide, which forms the tunnel barrier, if the heat of formation of the metal oxide is significantly greater than that of the ferromagnetic oxide.

However, the devices of Tsuge have considerably lower tunnel magnetoresistance values than those fabricated using other prior art methods of forming the tunnel barrier and magnetic tunnel junction. Evidently, Tsuge does not demonstrate any improvement over the prior art because the heat of formation of the metal oxide versus the formation of the ferromagnetic oxide is not the critical parameter in determining whether oxygen from the ferromagnetic oxide will diffuse away from this layer into the metal oxide layer. Even though the oxygen may be in a lower energy state in the oxide barrier, the metal oxide barrier will be fully oxidized by the process described by Tsuge because of the high heat of formation of the metal layers disclosed therein. Thus, all the oxygen sites in the metal oxide layer will be occupied, which does not allow for the diffusion of oxygen from the ferromagnetic oxide layer. Moreover, the diffusion of oxygen through a ferromagnetic oxide layer is likely to be small, so that the diffusion of oxygen from the ferromagnetic oxide into the metal oxide layer will require extreme conditions of high temperature. In other words, there will be considerable energy barriers to the flow of oxygen from the ferromagnetic oxide layer into the metal oxide layer, even if there are unoccupied oxygen sites in the metal oxide layer, so that oxygen will not diffuse over distances of more than about 1 atomic layer into the metal oxide layer. Thus it is not surprising that the devices formed by Tsuge have very low tunneling magnetoresistance values, because the surface of the ferromagnetic layer will not be free of oxide.

Hibino has employed a sequential deposition process to form $Al_2O_3$ tunnel barriers, but finds that the MR ratio decreases with time as the barriers are subjected to a temperature of 280° C. (see US 2002/0076940A1, published Jun. 20, 2002). Also, Hibino does not discuss or teach the use of preferred crystallographic orientations of his tunnel barriers.

There is a need for high quality, defect free MgO tunnel junctions, as well as MTJ devices having significantly higher magnetoresistance values than those in the prior art.

SUMMARY OF THE INVENTION

Methods are disclosed in which a MgO tunnel barrier is prepared with improved performance. In particular, the MgO barrier can be formed without oxidizing the lower ferromagnetic (or ferrimagnetic) electrode in magnetic tunnel junction devices, so as to give much higher tunnel magnetoresistance values than in the prior art. Similarly, much higher spin polarization values of tunneling current are obtained in tunnel junction devices with one or more ferromagnetic (or ferrimagnetic) electrodes. The MgO tunnel barrier so formed does not have a significant number of defects that would otherwise lead to hopping conductivity through the tunnel barrier. In preferred methods, highly oriented (100) MgO barriers are formed without using single crystalline substrates or high deposition temperatures, thereby facilitating the manufacture of devices using standard deposition techniques on polycrystalline or amorphous films. Post anneal treatments are preferred to improve the tunneling magnetoresistance, which can exceed 160% at room temperature.

One aspect of the invention is a method that includes depositing Mg onto a surface of an underlayer to form a Mg layer thereon, in which the surface is selected to be substantially free of oxide (i.e., for its lack of oxide content). The underlayer includes at least one layer of magnetic material selected from the group consisting of ferromagnetic materials and ferrimagnetic materials. The method further includes directing additional Mg, in the presence of oxygen, towards the Mg layer to form a MgO tunnel barrier in contact with the underlayer, with the oxygen reacting with the additional Mg and the Mg layer. The MgO tunnel barrier is advantageously in proximity with the magnetic material to enable spin-polarized current to pass between the tunnel barrier and the magnetic material, and the MgO tunnel barrier is annealed to improve its performance. In one preferred implementation, the magnetic material is body centered cubic (bcc) and is selected to be at least partially (100) oriented to improve the performance of the tunnel barrier. This magnetic material may advantageously be an alloy of Fe and Co, in which the Fe content of the alloy is between 1 and 90 (or even 1 and 99) atomic %, or Fe without Co may be used. The magnetic material may be in direct contact with the MgO tunnel barrier, or the underlayer may include a spacer layer that separates the magnetic material from the MgO tunnel barrier. The Mg layer deposited onto the surface of the underlayer preferably has a thickness of between 3 and 20 angstroms.

The method may further include forming an overlayer on the MgO tunnel barrier to form a magnetic tunnel junction, in which the overlayer includes a magnetic material selected from the group of materials consisting of ferromagnetic materials (e.g., such as alloy of Fe and Co) and ferrimagnetic materials, and wherein the tunnel junction is annealed to increase its tunnel magnetoresistance. In a preferred implementation, at least one of the underlayer and the overlayer includes antiferromagnetic material (such as PtMn or IrMn) that is exchange biased with ferromagnetic material of said at least one layer. The tunnel junction is preferably annealed at a temperature selected to yield a tunnel magnetoresistance that is greater than 100% at room temperature, more preferably greater than 140% at room temperature, and still more preferably greater than 160% at room temperature. The annealing temperature is preferably greater than 200° C. (e.g., in the range of 200° C. to 400° C.), and more preferably greater than 350° C. (e.g., in the range of 350° C. to 400° C.). Also, the tunnel junction is advantageously annealed at a temperature selected to be greater than an annealing temperature at which the tunnel magnetoresistance of the tunnel junction actually is reduced by the annealing process. In preferred implementations, the magnetic material of the overlayer and the magnetic material of the underlayer are both bcc and at least substantially (100) oriented. Also, the magnetic material of the overlayer and the magnetic material of the underlayer are preferably both in direct contact with the MgO tunnel barrier, and the MgO tunnel barrier is preferably at least substantially (100) oriented.

Another aspect of the invention is a method that includes providing a ferromagnetic underlayer having a surface that is substantially free of oxide and forming a Mg layer on the surface to both protect the underlayer from oxidation and to wet the underlayer. Oxygen and additional Mg are then directed onto the metal layer to form a MgO tunnel barrier that is in contact with the underlayer, in which the ferromagnetic underlayer is selected to be bcc and at least partially (100) oriented to improve the performance of the tunnel barrier. In a preferred implementation, a ferromagnetic overlayer is formed over the MgO tunnel barrier (e.g., directly on the MgO tunnel barrier, if no spacer layer is used) to form a magnetic tunnel junction, and the MgO tunnel junction is annealed to improve its performance. The tunnel junction is preferably annealed at a temperature selected to yield a tunnel magnetoresistance that is greater than 100% at room temperature, more preferably greater than 140% at room temperature, and still more preferably greater than 160% at room temperature. The tunnel junction is preferably annealed at a temperature greater than 200° C. (e.g., in the range of 200° C. to 400° C.), and more preferably at a temperature greater than 350° C. (e.g., the range of 350° C. to 400° C.). Preferably, the ferromagnetic material of the overlayer and the ferromagnetic material of the underlayer, as well as the MgO tunnel barrier, are substantially (100) oriented. The Mg layer deposited onto the surface of the underlayer preferably has a thickness of between 3 and 20 angstroms.

In a further aspect of the invention, there is provided a method that includes depositing Mg onto a surface of an underlayer to form a Mg layer thereon, in which the surface is selected to be substantially free of oxide. The method further includes directing additional Mg, in the presence of oxygen, towards the Mg layer to form a MgO tunnel barrier that is in contact with the underlayer, in which the oxygen reacts with the additional Mg and the Mg layer to form the MgO tunnel barrier, and annealing the MgO tunnel barrier to improve its performance. The thickness of the Mg layer is preferably selected to be large enough to prevent oxidation of the underlayer but small enough that, upon reaction of the oxygen with the Mg layer, substantially all the Mg in the Mg layer is converted into MgO. The Mg layer preferably has a thickness of between 3 and 20 angstroms, more preferably between 4 and 8 angstroms, and still more preferably between 3 and 8 angstroms. In one preferred method, the underlayer includes a semiconductor, such as GaAs. In another preferred method, an overlayer is formed on the MgO tunnel barrier, in which one of the overlayer and the underlayer includes a non-ferromagnetic, non-ferrimagnetic metal layer, and the other of the overlayer and the underlayer includes a ferrimagnetic layer.

In another preferred method of said further aspect of the invention, an overlayer is formed on the MgO tunnel barrier, in which one of the overlayer and the underlayer includes a non-ferromagnetic, non-ferrimagnetic metal layer, and the other of the overlayer and the underlayer includes a ferromagnetic layer. This preferred method may further include constructing a magnetic tunneling transistor that includes the non-ferromagnetic, non-ferrimagnetic metal layer, the MgO tunnel barrier, and the ferromagnetic layer. The non-ferromagnetic, non-ferrimagnetic metal layer may include a metal selected from the group consisting of Cu, W, Al, AlN, Nb, NbN, WTi, Ti, TiN, Ta, and TaN. The ferromagnetic layer may include a ferromagnetic material selected from the group consisting of i) Fe, ii) an alloy of Co and Fe, iii) an alloy of Ni and Fe, and iv) an alloy of Ni and Fe and Co. Preferably, the ferromagnetic material and the MgO tunnel barrier are substantially (100) oriented, and the ferromagnetic material is bcc.

In still another preferred method of said further aspect of the invention, an overlayer is formed on the MgO tunnel barrier, in which the overlayer and the underlayer comprise respective non-ferromagnetic, non-ferrimagnetic metals. The metals may be selected from the group consisting of Cu, Al, AlN, W, Nb, NbN, Pt, Pd, Ir, $RuO_2$, Ru, and $IrO_2$.

A preferred embodiment of the invention is a structure that includes an underlayer having a surface that is substantially free of oxide formed from the underlayer (e.g., native oxide), a MgO tunnel barrier in contact with the surface of the underlayer, and an overlayer, in which the MgO tunnel barrier is in contact with a surface of the overlayer, with the MgO tunnel barrier being sandwiched between the underlayer and the overlayer. The surface of the overlayer is preferably substantially free of oxide formed from the overlayer (e.g., native oxide). At least one of the overlayer and the underlayer may include a spacer layer that is in contact with the MgO tunnel barrier, in which the spacer layer is selected to not substantially interfere with the tunneling properties of the MgO tunnel barrier. In one preferred embodiment, at least one of the underlayer and the overlayer include a ferromagnetic and/or ferrimagnetic material.

In another preferred embodiment, the overlayer and the underlayer include respective magnetic materials (e.g., ferromagnetic materials) that together with the MgO tunnel barrier form a magnetic tunnel junction, in which i) the amount of any oxide separating the MgO tunnel barrier from the magnetic materials is sufficiently low, and ii) the MgO tunnel barrier, the underlayer, and the overlayer are sufficiently free of defects, that the room temperature tunnel magnetoresistance of the magnetic tunnel junction is greater than 70% (more preferably greater than 100%, and still more preferably greater than 160%). At least one of the underlayer and the overlayer may include antiferromagnetic material that is exchange biased with the magnetic material of that layer, in which the antiferromagnetic material includes at least one alloy selected from the group consisting of Ir—Mn and Pt—Mn, with the alloy being substantially (100) oriented and fcc or slightly distorted fcc. The underlayer may include antiferromagnetic material over (e.g., in contact with) at least one layer selected from the group consisting of Ta and TaN.

In yet another preferred embodiment, the underlayer and the overlayer include respective non-ferromagnetic, non-ferrimagnetic metals.

In still another preferred embodiment, one of the underlayer and the overlayer includes a layer of magnetic (e.g., ferromagnetic) material, and the other of the underlayer and the overlayer includes a layer of non-ferromagnetic, non-ferrimagnetic metal. In this embodiment, it is preferred that i) the amount of any oxide separating the MgO tunnel barrier from the underlayer and the overlayer is sufficiently low, and ii) the MgO tunnel barrier, the underlayer, and the overlayer are sufficiently free of defects, that the spin polarization of tunneling current passing through the structure is greater than 50%, and more preferably greater than 70%.

For several aspects and embodiments of the invention disclosed herein, a MgO tunnel barrier is sandwiched between an underlayer and an overlayer, either one or both of which may include one or more layers of a ferromagnetic material, a ferrimagnetic material, and/or a semiconductor. While the MgO tunnel barrier is preferably in direct contact with the ferromagnetic material, ferrimagnetic material and/or semiconductor, each of the underlayer and overlayer may optionally include one or more spacer layers which are adjacent to the MgO tunnel barrier but which do not significantly affect the tunneling properties of the MgO layer, e.g., by not significantly diminishing the spin polarization of electrons tunneling through the MgO tunnel barrier.

Performance of the MgO tunnel barriers disclosed herein may be improved through annealing, wherein performance refers to various attributes of the MgO tunnel barrier or associated device. For example, annealing a magnetic tunnel junction improves, in particular, its magneto-tunneling resistance; annealing a tunnel barrier improves, in particular, its spin polarization; annealing a MIM or a capacitor improves, in particular, its leakage current or barrier height.

The preferred embodiments and implementations herein are directed to structures in which the magnetic material has a body-centered cubic (bcc) lattice, since this lattice type leads to the best performance of the MgO tunnel barrier (e.g., the highest TMR for a MgO tunnel junction). It should be noted, however, that in thin films, because of strain induced by overlayers and/or underlayers, the in-plane and out-of-plane lattice constants may be slightly different, and the lattice may be slightly distorted from the pure bcc case, e.g., as a result of a tetragonal distortion. As used herein, the term "body centered cubic" (bcc) should be construed broadly enough to encompass such deviations from the pure bcc case.

The preferred embodiments and implementations of the invention are directed to magnetic layers and MgO tunnel barrier layers which are substantially (100) oriented or textured. The magnetic and tunnel barrier layers are polycrystalline and are comprised of grains or crystallites which range in lateral extent from approximately one hundred to several hundred angstroms. Thus, these layers and the overall film structure are what is commonly referred to as textured. Texturing implies that there is a predominant crystallographic orientation of individual layers and/or the overall film structure, but that the grains are not perfectly aligned along one particular direction. Individual grains may not be precisely oriented with their (100) direction along the normal to the film layer, but the (100) direction within individual grains may be oriented away from the normal to the plane of the film by an angle that can vary from a small fraction of one degree to several degrees or even tens of degrees for poorly textured films. The angular range of these (100) directions can be used to quantify the degree of (100) crystalline texture of the film structure and can be measured using various structural characterization techniques, including cross-section transmission electron microscopy and various x-ray diffraction techniques. There may also be present grains which are oriented in a completely different direction, but the proportion of these grains is small for the method of formation of the magnetic tunnel junction structures described herein. Note that the crystalline grains are randomly oriented with respect to a direction within the plane of the substrate on which the film structures are grown. It is the orientation or texturing of the film which is important with regard to the preferred embodiments herein. Whereas the maximum TMR is obtained for film structures which are highly textured, the TMR will be increased to the extent that the film structure is textured. It is preferred that the angular range of a (100) direction within the grains be within + or −20 degrees of the film normal, or more preferably within + or −10 degrees, and even more preferably within + or −5 degrees. As used herein, the term "(100) oriented" should be understood to include the aforementioned deviations from the ideal case, in which all the grains are precisely oriented with their (100) direction along the normal to the film layer.

Notwithstanding the polycrystalline nature of the film structures described herein, which are in any case preferable for ease of manufacturing, the method of forming the MgO tunnel barrier described herein can also be applied to the growth of epitaxial single crystalline film structures wherein the structures are prepared on a face of a single crystalline substrate chosen so that the crystalline spacing and crystalline cell is compatible with the growth of a bcc ferromagnetic metal layer oriented in the (100) growth direction and the subsequent growth of a MgO tunnel barrier according one of the preferred embodiments described herein.

For a fuller understanding of the nature and advantages of the present invention, reference should be made to the following detailed description taken together with the accompanying figures.

DESCRIPTION OF THE PREFERRED EMBODIMENTS

Figure 1:
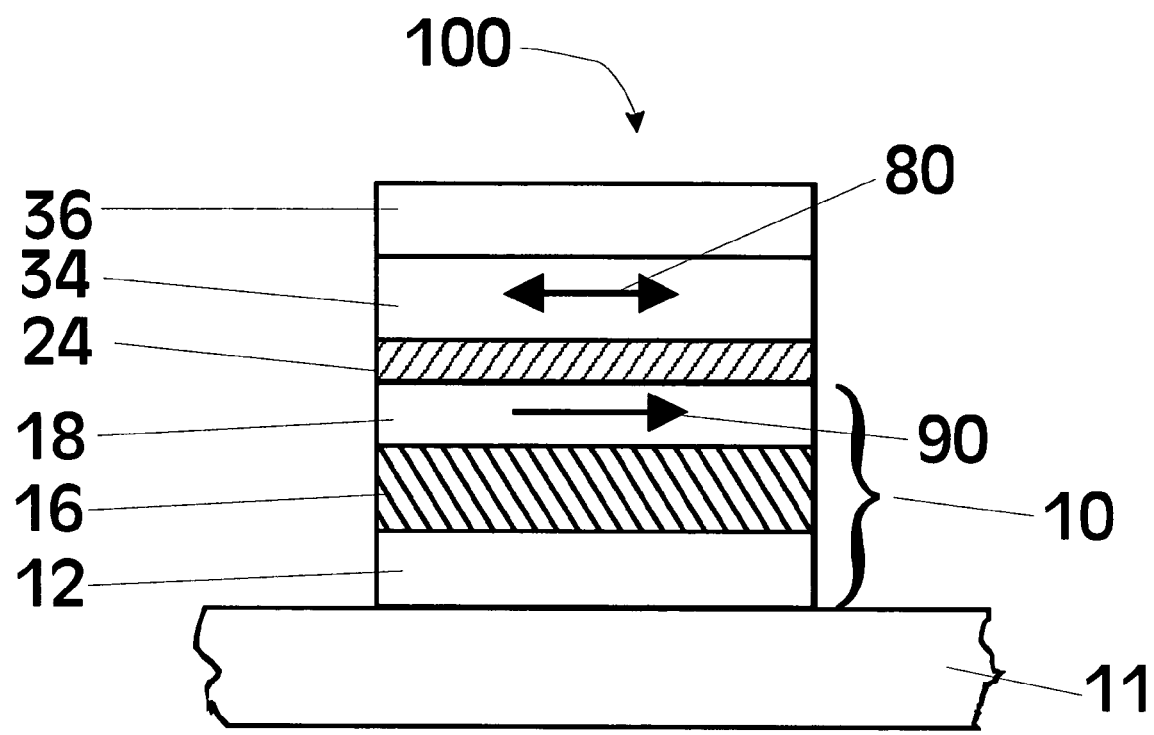
FIG. 1 is a schematic of a magnetic tunnel junction formed in accordance with the prior art.

To date the tunneling barrier that has been most extensively studied for MTJs is alumina ($Al_2O_3$), where the ferromagnetic electrodes are typically formed from various Ni—Fe or Co—Fe or Ni—Co—Fe alloys. While a wide variety of methods have been used to deposit the alumina tunneling barrier, perhaps the most widely used method is one in which a thin layer of metallic Al is first deposited. Subsequently this layer is oxidized, either by "natural oxidation", in which the Al layer is exposed to oxygen or air, or by plasma oxidation, in which the Al layer is placed in an oxygen plasma and the Al layer is often electrically biased by a few volts to enhance the plasma oxidation. The Al layer can also be oxidized by a beam of energetic oxygen ions. For thinner Al layers, it is usually preferred to oxidize the Al layer by natural oxidation. In view of this prior art method of forming $Al_2O_3$, the formation of MgO tunneling barriers was extensively studied by first depositing thin Mg layers and then oxidizing the Mg layer either by natural oxidation or by plasma oxidation. Neither of these methods is successful in realizing high quality tunnel barriers. In particular, natural oxidation is ineffective at room temperature. Similarly, under the same conditions in which it is possible to plasma oxidize Al layers with thicknesses ranging from a few angstroms to several tens of angstroms, Mg layers are only poorly oxidized. More aggressive oxidation conditions (e.g., longer oxidation times, higher bias voltages or more intense oxygen plasmas) do not appear to help oxidize the Mg layer. The barriers were usually electrically shorted, as if either an incomplete magnesium oxide layer (if any) was formed, or the MgO layer formed was too thin or not continuous. For example, it is possible that the surface of the Mg layer formed an oxide, which then prevented the Mg layers underneath from oxidizing. Most of these experiments were carried out using shadow masked junctions which requires relatively thick barriers to develop enough resistance across the barrier for reliable measurements of the junction's electrical properties. Limited studies of thinner barriers were carried out using lithographic processing of micron sized junctions to explore much thinner Mg layers. These studies also gave rise to electrically shorted junctions. Thus, it appears that using conventional means to form MgO tunnel barriers do not lead to useful structures.

Following these experiments, studies were carried out in which the MgO tunnel barrier was formed by reactive sputtering of Mg using oxygen or argon-oxygen plasmas onto various ferromagnetic electrodes, including those made of Fe and Co—Fe alloys. These experiments showed that a tunnel barrier could be formed, but that the TMR of the MTJs was always very small or, depending on the ferromagnetic electrode, was negative in sign (i.e., the resistance was higher for the parallel configuration compared to the anti-parallel configuration of the ferromagnetic electrodes). During the process of forming the MgO tunnel barrier, it seemed very likely that the surface of the lower ferromagnetic electrode became oxidized, thereby reducing the TMR when the electrode was formed from Co—Fe or Ni—Fe alloys. Moreover, the resistance of the tunneling barrier was also increased, consistent with the formation of an insulating oxide at the surface of the lower ferromagnetic electrode which increased the effective tunnel barrier thickness.

Figure 2A:
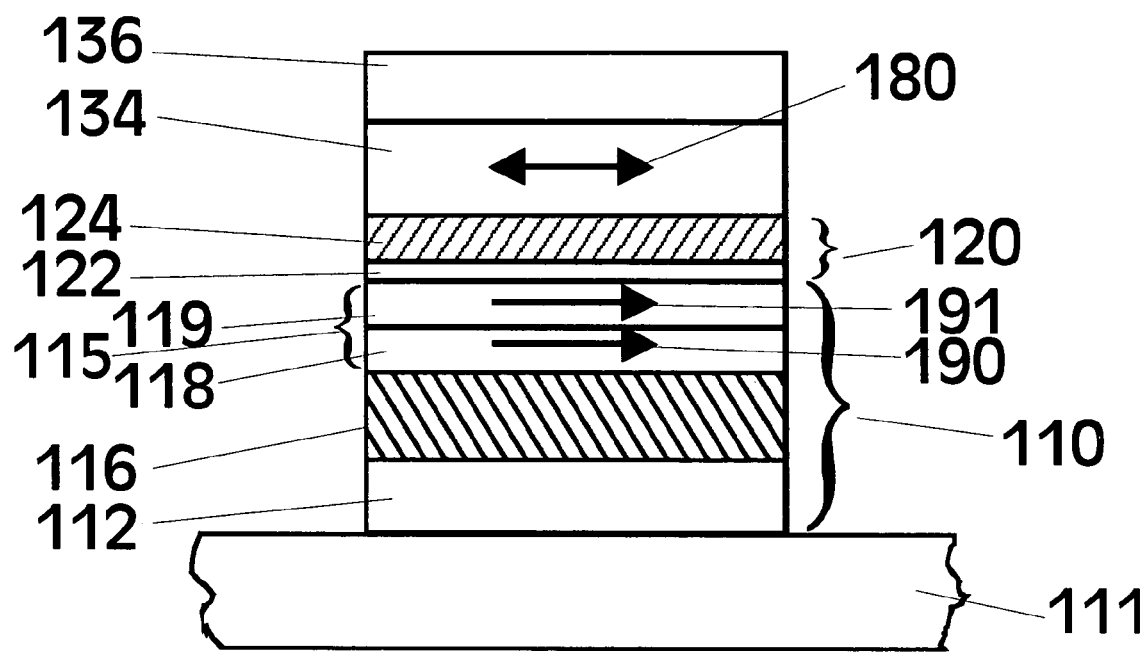
FIG. 2A illustrates the sequence of layers that are deposited to form a magnetic tunnel junction of the present invention.
Figure 2B:
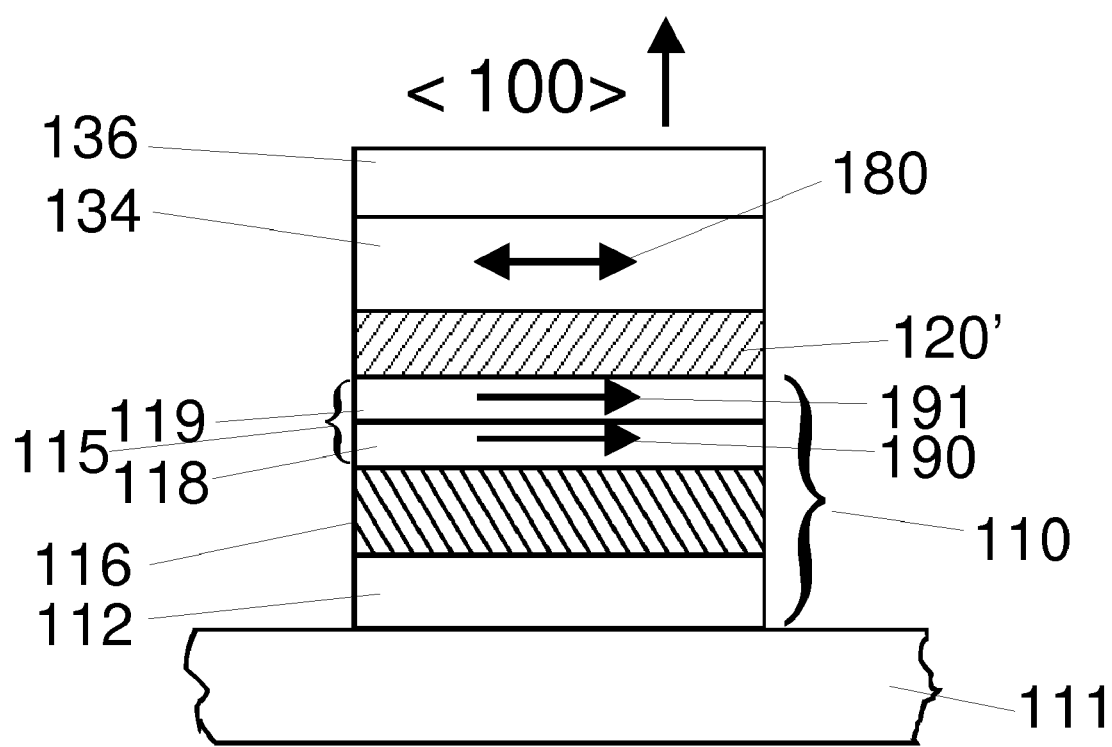
FIG. 2B is a cross sectional view of the magnetic tunnel junction that is formed according to the methodology of FIG. 2A.

To prevent the oxidation of a lower electrode formed from Fe, a method of forming the MgO barrier was developed in which a thin layer of metallic Mg was first deposited on top of the Fe layer and then a layer of MgO was deposited on top of this Mg layer through the reactive sputtering of Mg in an $Ar-O_2$ plasma. Using this method of preparing the MgO barrier, very high tunneling magnetoresistance values were obtained, much higher than any previously reported values for any MTJ at room temperature. FIG. 2A illustrates this process, in which a tunnel barrier 120 is formed by first depositing a thin Mg layer 122 followed by deposition by reactive sputtering of an MgO layer 124. As shown in FIG. 2B and discussed in more detail below, it is more appropriate to view the MgO tunnel barrier as a single layer 120', since the layer 122 is oxidized to form MgO, with the layers 122 and 124 becoming largely indistinguishable as a result. For example, the layers 122 and 124 are not distinguishable in a cross-sectioned slice of the device examined in a transmission electron microscope. FIG. 2A shows a device that includes a substrate 111, a bottom electrical lead 112, an antiferromagnetic layer 116, a fixed ferromagnetic layer 118, a "free" ferromagnetic layer 134, and a top electrical lead 136, all of which are similar to their counterparts 11, 12, 16, 18, 34, and 36, respectively; these layers, as well as other layers and components referred to herein, may be constructed using techniques known to those skilled in the art. The arrows 180 and 190 illustrate possible orientations of the magnetic moments of the free ferromagnetic layer 134 and the fixed ferromagnetic layer 118, respectively. As shown in FIGS. 2A and 2B, the fixed ferromagnetic layer may actually be a bilayer 115 of two different ferromagnetic layers 118 and 119, each having a magnetic moment oriented as indicated by the arrows 190 and 191, respectively. The bilayer 115, the antiferromagnetic layer 116, and the bottom lead 112 of FIGS. 2A and 2B constitute a lower electrode 110.

Figure 3:
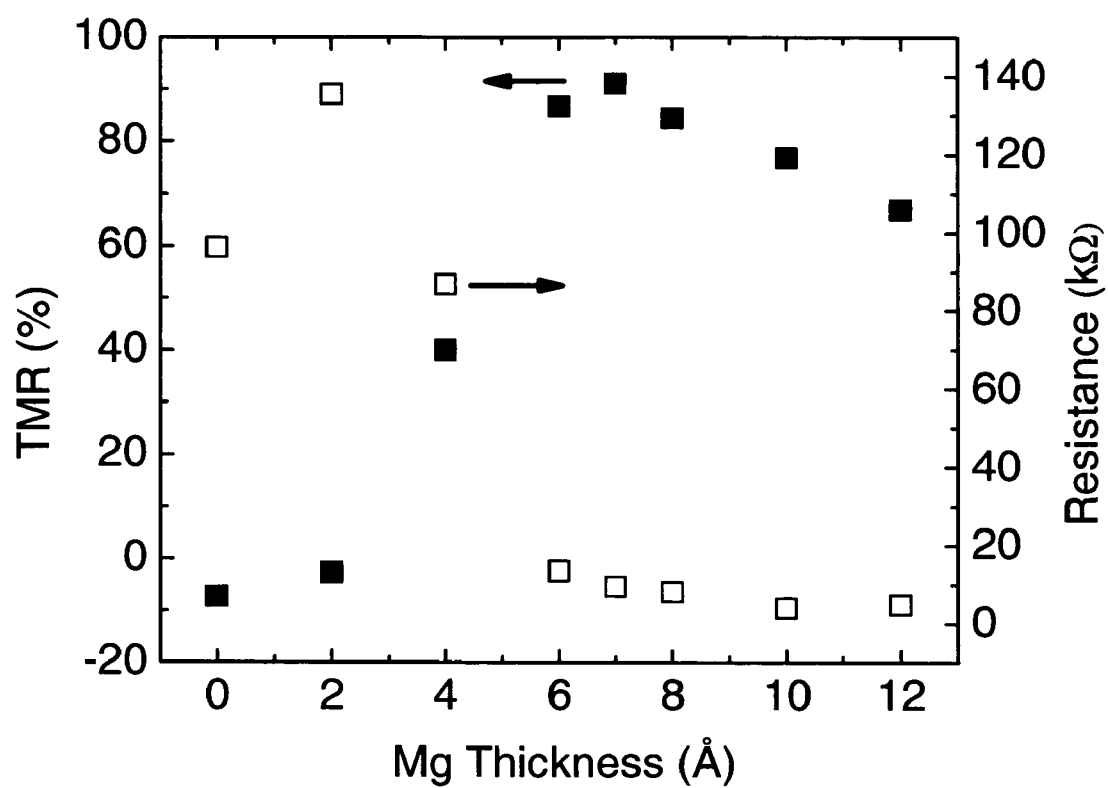
FIG. 3 shows the dependence of tunneling magnetoresistance and resistance on the thickness of a Mg layer used in forming a MgO tunnel barrier of a magnetic tunnel junction of the present invention.

FIG. 3 shows the detailed dependence of resistance and TMR on the thickness of the Mg layer 122 for a series of otherwise nominally identical MTJs with a structure formed from 75 Å Ta/250 Å $Ir_{26}Mn_{74}$/8 Å $CO_{84}Fe_{16}$/18 Å Fe/t Mg/18 Å MgO/200 Å $CO_{84}Fe_{16}$/100 Å Ta, in which the thickness of the Mg layer t is indicated in angstroms. The MgO layer was formed by reactive sputtering of Mg in a 93% Ar-7% $O_2$ gas mixture. The Mg thickness was varied from 0 to approximately 20 Å (data only shown in FIG. 3 for thicknesses up to 12 Å). As shown in FIG. 3, TMR values of more than 90% are obtained at room temperature for Mg layer thicknesses of ~6 to 7 Å. For Mg layers thicker than this optimal thickness, the TMR decreases slowly for increasing Mg layer thickness, and the resistance of the junction is only weakly dependent on Mg thickness. Below this optimal thickness, the TMR is suppressed and the resistance is much increased by more than an order of magnitude. In the absence of the Mg layer 122, the TMR is small due to oxidation of the Fe underlayer. In order to prevent the oxidation of the Fe surface, it was found that a layer of Mg at least 5 to 6 angstrom thick should be deposited. Presumably, thinner Mg layers do not completely cover or wet the Fe surface, thereby allowing some oxidation of this surface. The dependence of the resistance of the tunnel junction on the Mg metal layer thickness is a very useful criterion for determining the optimum thickness of this layer. The resistance of the junction rapidly increases when this layer is reduced below the optimum thickness, because the lower ferromagnetic electrode becomes oxidized.

The preferred range of thickness of the Mg layer 122 is from about 3 to 20 Å, more preferably from about 3 to 10 Å, and still more preferably from about 4 to 8 Å. The lower thickness is determined by the wetting of the Mg on the ferromagnetic layer 119. If a thinner Mg layer can be formed on this lower ferromagnetic electrode so that it completely covers the ferromagnetic layer with an approximately uniform thickness, then thinner Mg layers can be used. For example, the use of surfactants, such as oxygen, Ag, Pb, Bi, Sb and so on, are known to aid in the formation of ultra thin and smooth metallic layers. Thus, by using a surfactant, thinner Mg layers may be formed which cover completely the lower ferromagnetic layer and, therefore, the minimum thickness of Mg required to prevent oxidation of the lower ferromagnetic electrode is reduced.

As first shown by Parkin (see U.S. Pat. No. 5,764,567) the introduction of thin non-magnetic metallic layers between the ferromagnetic electrodes and the tunneling barrier in MTJs leads to a rapid decrease of the TMR. By contrast, for the case of Mg layers (which are metallic), very high TMR values are observed. The reason is that the Mg layer 122 is oxidized during the subsequent deposition of the MgO layer 124. This is confirmed by cross-section transmission electron microscopy (XTEM) studies, which show no obvious distinction between the Mg layer 122 and the MgO layer 124, so that effectively a single layer of MgO 120' is formed. Moreover, these XTEM studies reveal that the MgO layer 120' that is formed is not only crystalline, but is crystallographically oriented with respect to the lower Fe electrode 118. (By contrast, $Al_2O_3$ tunnel barriers are usually amorphous and without any crystallographically ordered structure except under very special circumstances.) The thickness of the resulting MgO layer 120' is preferably in the range of 3-50 angstroms, more preferably 3-30 angstroms, still more preferably 3-20 angstroms, and most preferably 4-15 angstroms.

The lower ferromagnetic electrode for the samples whose data is shown in FIG. 3 is preferably grown on top of Ta (layer 112) and IrMn (layer 116). The IrMn is an antiferromagnetic layer and is used to exchange bias the lower ferromagnetic electrode. (Alternatively, Pt—Mn may be used.) The preferred composition of the $Ir_xMn_{1-x}$ is when the Ir content is between 10 and 30 atomic percent. This composition range is chosen so that thin films of the Ir—Mn alloy are antiferromagnetic with blocking temperatures well above the operating temperature range of the tunnel junction device. The layer 112 can be formed from Ta or TaN or from Ta layers including lesser amounts of nitrogen. The layer 112 can also be formed from a bilayer of TaN and Ta. Ta, TaN, and a TaN/Ta bilayer are advantageous since layers of IrMn (or PtMn) deposited on top of them are (100) oriented. Similarly, Ti and TiN layers or TiN/Ti bilayers, can also be used to give (100) oriented layers of IrMn (or PtMn). The layer 112 may also incorporate a layer of MgO which typically grows textured in the (100) orientation and so can help improve the (100) texture of the IrMn layer 116.

Growth of IrMn on Ta leads to a (100) growth texture for the face-centered cubic (fcc) IrMn layer. The fcc lattice may be slightly distorted due to in-plane compression or expansion of the fcc lattice. The lower ferromagnetic electrode may be formed from a bilayer 115 of $CO_{84}Fe_{16}$ (layer 118) and Fe (layer 119). The $CO_{84}Fe_{16}$ layer 118 grows (100) oriented on top of the (100) textured IrMn layer 116. Then the Fe layer 119, which is grown on top of the (100) oriented $CO_{84}Fe_{16}$ layer 119, is bcc and also grows (100) oriented. By preparing a (100) oriented bcc template layer of Fe, the MgO deposited on top of this layer also grows (100) oriented. Thus, for this combination of layers, the MgO barrier 120' that is formed also grows textured in the (100) direction, thereby leading to high TMR. By changing the layer 112 or by changing the antiferromagnetic layer 116, the texture of the lower ferromagnetic electrode can be varied. For example, by using Ta/Pt or Ta/Al or Ta/Pd or Ti/Pd as layers 112, the IrMn layer grows textured in the (111) orientation, whereas layers 112 of TaN/Ta, Ta or Ti lead to (100) textured IrMn. The texturing of these layers can be varied by varying their thicknesses or growth temperature. For the samples of FIG. 3, all the layers were deposited at nominally room temperature, although the ambient temperature at the substrate position within the sputter deposition system is typically a little higher than room temperature because of the considerable energy injected into the magnetron plasma sources. Thus, the temperature at the substrates is likely in the range of 40 to 50° C.

By changing the texturing of the IrMn layer 116 from (100) to (111), by changing the layer 112 from, for example, Ti to, for example, a bilayer formed from Ti and Pd layers, the TMR of the resulting MTJ is considerably reduced from values of between ~40 and ~70% to much lower values of between 25 and 35%. These TMR values correspond to the as deposited MTJs. As discussed below, these TMR values can be considerably increased by thermal treatments. Moreover, the TMR of the as-deposited MTJs is likely reduced because the magnetic moment of the pinned layer 118 is not well oriented because the exchange bias provided by the antiferromagnetic layer 116 usually requires a thermal treatment to make it most effective. When the IrMn layer grows in the (111) texture, the $CO_{84}Fe_{16}$ or Fe layers grown on top of the IrMn layer grow bcc but are oriented in the (110) crystallographic direction. The MgO layer grows in the (111) texture. The different texturing of the MgO layer, whether (100) or (111), and the underlying ferromagnetic electrode, whether (100) or (110), which is dependent on the layers onto which the IrMn layer is grown, clearly influences the magnitude of the TMR effect. Thus the (100) texturing of the MgO layer and underlying ferromagnetic electrode can be very important in forming MTJs with high TMR.

It is important that the interface between the underlying ferromagnetic layer 119 and the MgO tunnel barrier 120 is free of ferromagnetic oxide. If the Mg layer 122 is not thick enough or is rough (for example, if the deposition temperature is too high) so that there are thin regions within the Mg layer, then the ferromagnetic layer may become oxidized during the formation of the layer 124. The oxidation of the lower ferromagnetic layer will result in a diminished tunneling magnetoresistance (compared to the case in which the ferromagnetic layer is free of oxide), which cannot be significantly improved by subsequent thermal treatments. Studies were carried out in which, after the ferromagnetic layer 119 is deposited, oxygen is introduced into the deposition chamber. The introduction of oxygen, even at much lower gas pressures than used for the reactive deposition of the MgO layer 124, results in reduced values of tunneling magnetoresistance for Co—Fe and Ni—Fe and Co—Ni—Fe alloys.

Figure 4:
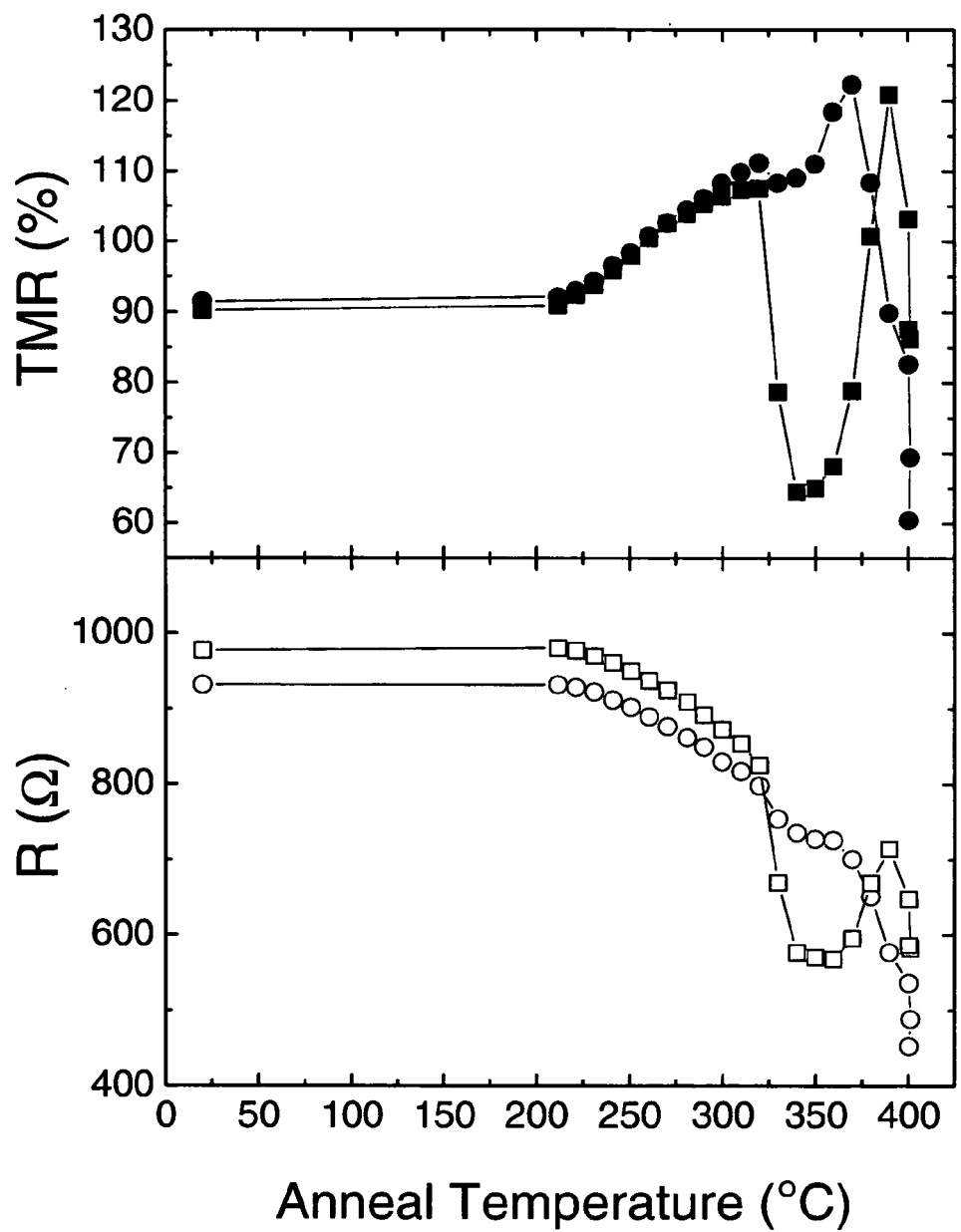
FIG. 4 illustrates how the tunneling magnetoresistance and resistance (measured at 25° C.) vary as a function of annealing temperature for two magnetic tunnel junction devices formed in accordance with the present invention.

A second advantageous step in obtaining MTJs with high TMR values is to thermally anneal the MTJ after forming the structure shown in FIG. 2B. Typical results are shown in FIG. 4 for an MTJ with a lower electrode 110 formed from TaN (layer 112) 100 Å thick, a 250 Å thick $Ir_{25}Mn_{75}$ layer 116, an 8 Å thick $CO_{84}Fe_{16}$ layer 118, and a 18 Å thick Fe layer 119. The tunnel barrier 120' is formed by depositing a 7 Å thick Mg layer 122 followed by a 16 Å thick MgO layer 124. The MgO layer 124 is formed by reactive sputtering from a metallic Mg target in an argon-oxygen gas mixture. The sputtering gas is predominantly formed from argon, with oxygen being in the range of 1.5 to 9% by volumetric flow of gas at standard temperature and pressure. Thus this corresponds to the relative molecular percentage of the components in the gas mixture. The oxygen partial pressure is kept sufficiently low to prevent "poisoning" of the metallic Mg sputtering target but is sufficient to form a fully oxidized MgO layer. Poisoning of the target can lead to irreproducible deposition rates especially when the same target is used to form both the Mg layer 122 and the MgO layer 124. Conditioning of the target between depositing the Mg and MgO layers is very helpful in obtaining reproducible results. Conditioning may be carried out by pre-sputtering the target either in argon prior to deposition of the Mg layer 122 or in argon-oxygen prior to deposition of the MgO layer 124. The optimum concentration of oxygen in the sputtering gas depends on the detailed geometry and size of the deposition chamber, the pumping speed of the vacuum pumps attached to the system, as well as the power applied to the Mg sputtering source. The deposition rate of the MgO will be influenced by the power applied to the Mg sputter gun as well as the oxygen concentration in the sputter gas, and the sputtering gas pressure, as well as geometric factors such as the distance from the sputter source to the substrate. Typically, it is preferred to use the smallest possible amount of oxygen not only to prevent contamination of the deposition chamber and other sputtering targets in the chamber but also because the thermal stability of the MgO tunnel barrier is influenced by small amounts of excess oxygen in or on top of this layer.

Finally, the ferromagnetic layer 134, which acts as the counter electrode of the MTJ for the samples used in collecting the data shown in FIG. 4, was formed from a 100 Å thick $CO_{84}Fe_{16}$. The capping layer 136 (which acts as the top electrical lead) is formed from a 100 Å thick Ta layer.

FIG. 4 shows TMR data measured on two different shadow masked MTJs at 25° C. after the MTJ has been annealed at a sequence of increasing anneal temperatures. The magneto-transport properties of ten different shadow masked magnetic tunnel junctions on one wafer are first measured at 25° C. The wafer is then heated in the presence of a magnetic field large enough to fully saturate the magnetization of the pinned layer 115 to an anneal temperature $T_A$ and then annealed at this temperature for 15 minutes in the presence of this magnetic field. The sample is subsequently cooled back down to 25° C. in the presence of the same magnetic field. For the data in FIG. 4, a field of 4,000 Oe was used and the sample was annealed in a high-vacuum anneal furnace that has a base pressure of $5 \times 10^{-8}$ Torr. During annealing the pressure is increased in the anneal furnace to $\sim 1 \times 10^{-7}$ Torr due to out-gassing within the furnace. This procedure is repeated for a series of anneal temperatures. FIG. 4 summarizes the magnitude of the tunneling magnetoresistance and the resistance of two different shadow masked tunnel junctions at 25° C. after anneal treatments for anneal temperatures up to 400° C. As shown FIG. 4, the resistances of the two junctions, which have a nominal area of $\sim 100 \times 100$ ($\mu$m)$^2$, are very similar and decrease slowly with increasing anneal temperatures up to $\sim 320°$ C. Over the same anneal temperature range their TMR values increase steadily up to about 100-110%. As the anneal temperature is increased further, the resistance of one junction continues to decrease slowly and the TMR continues to increase slowly for $T_A$ up to $\sim 370°$ C., where the TMR attains a value of nearly 125%. The second junction also displays a TMR of a similar magnitude after being annealed at 390° C., but at intermediate anneal temperatures both the resistance and TMR are substantially lowered. Surprisingly, at higher anneal temperatures the TMR and resistance recover. The non-monotonic dependence of TMR and resistance on anneal temperature for this second junction suggest that the junction partially breaks down but then remarkably repairs itself with additional annealing at higher temperatures. At anneal temperatures higher than 390° C., the resistance and TMR of both junctions decreases. A sequence of successive anneals was carried out at 400° C. and high TMRs of more than 50% were maintained even after 6 hours of accumulated anneal time at this temperature.

During the deposition of the layer 124, the Mg layer 122 is exposed to oxygen and will become partially or completely oxidized, depending on the oxidation conditions and the thickness of the Mg layer 122. During the thermal anneal treatments the Mg layer may become further oxidized or the texture of this layer or the crystallographic order of this layer may improve. In any case, the layer 122 will essentially be oxidized to form MgO so that the layers 122 and 124 will become largely indistinguishable. This is illustrated in FIG. 2B where layers 122 and 124 are shown as a single layer 120'. Cross-section transmission electron microscopy of a completed MTJ structure confirms that the Mg layer 122 has been substantially converted to MgO, and that this layer is not distinct from the layer 124 either in composition or texture.

Both the free ferromagnetic layer 134 and the pinned lower ferromagnetic layer 115 can be formed from a single layer of homogeneous ferromagnetic material or, alternatively, from two or more layers of different ferromagnetic metals. In the latter case, using a bilayer for the lower ferromagnetic electrode (layers 118 and 119) allows for the independent optimization of the exchange bias field and the magnitude of the tunneling magnetoresistance effect. The MTJ devices used in the collection of the data shown in FIG. 4 have a lower ferromagnetic electrode 115 formed from a bilayer of 8 Å $CO_{84}Fe_{16}$/18 Å Fe. The Co—Fe layer 118 gives a higher exchange bias with the IrMn antiferromagnetic layer than by having Fe directly at the IrMn interface. The Fe layer 119 is used to give higher TMR values in the as-deposited sample although after anneal treatments the magnitude of the TMR is similar for both $CO_{84}Fe_{16}$ and Fe layers at the interface between the layer 115 and the MgO tunnel barrier 120'. However, the lower electrode 115 can also be formed solely from Fe, and high TMR values similar to those shown in FIG. 4 are also obtained (although typically with lower exchange bias fields).

The MTJs in FIG. 4 have a free ferromagnetic layer 134 formed from $CO_{84}Fe_{16}$. Typically, lower TMR values are obtained when the counter electrode 134 is formed solely from Fe or with an Fe layer at the MgO/free ferromagnetic layer interface. Moreover, the thermal stability of such structures is also reduced.

Figure 5:
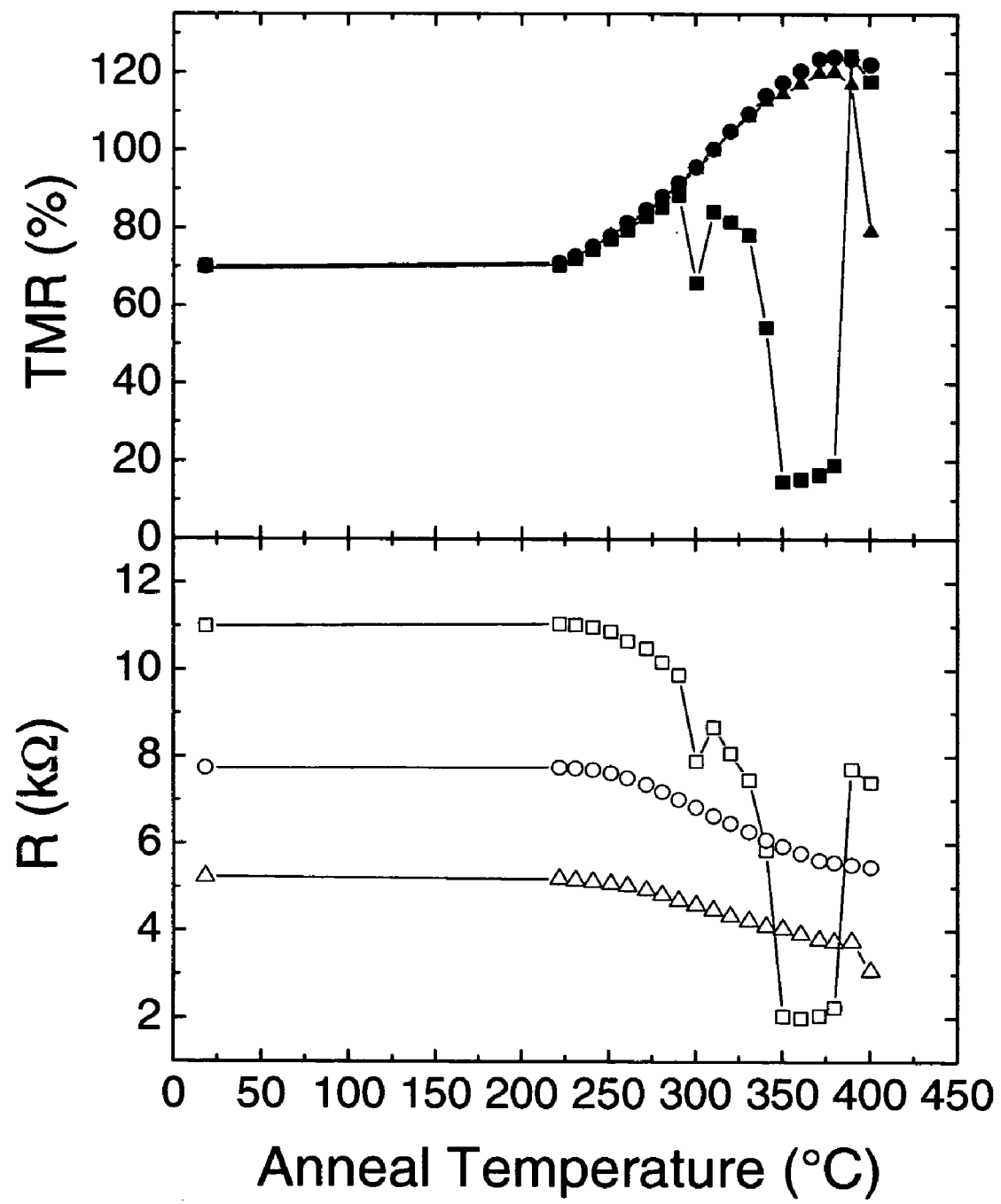
FIG. 5 illustrates how the tunneling magnetoresistance and resistance (measured at 25° C.) vary as a function of annealing temperature for three magnetic tunnel junction devices formed in accordance with the present invention.

The pinned ferromagnetic layer 115 can be formed from various Co—Fe alloys. In particular, the pinned ferromagnetic layer 115 can be formed from a single layer of Co—Fe without any Fe layers being present. FIG. 5 shows typical TMR and resistance data at 25° C. versus anneal temperatures up to 400° C. for MTJs with $CO_{84}Fe_{16}$ pinned ferromagnetic layers. These MTJs have lower electrodes 110 formed by first depositing layers of 100 Å thick TaN (layer 112) followed by exchange bias layers of 250 Å thick IrMn (layer 116). The pinned ferromagnetic electrode is formed from a single layer of 26 Å $CO_{84}Fe_{16}$ (layer 118; there is no separate layer 119 in this case). The tunnel barrier 120' is formed by first depositing a layer of Mg metal 8 Å thick (layer 122) and an MgO layer by reactive sputtering of Mg in an Ar-5% $O_2$ gas mixture (layer 124). The free ferromagnetic layer is formed from 200 Å $CO_{84}Fe_{16}$ (layer 134) and the capping layer 136 is formed from 100 Å Ta.

Data for three nominally identical shadow masked junctions are shown in FIG. 5. The resistances of the three junctions vary by about a factor of two partly because of variations in the junction areas and partly because of small variations in Mg and MgO thicknesses across the substrates on which the MTJs are formed. Just as for the samples shown in FIG. 4, the TMR increases significantly on annealing. The TMR reaches a value of $\sim 125$% at 25° C. following a sequence of anneals at temperatures up to 400° C. Thus, these MTJs display remarkable thermal stability and are much more thermally stable than MTJs formed with prior art MTJs with $Al_2O_3$ tunnel barriers. The thermal stability of these MTJs with $CO_{84}Fe_{16}$ fixed ferromagnetic layers is improved over MTJs with CoFe/Fe fixed ferromagnetic layers. However, just as for the MTJs with CoFe/Fe fixed layers, occasionally the resistances of some of these MTJ devices show non-monotonic variations in resistance and TMR with increasing anneal temperature. This behavior is most likely associated with some sort of defect or defects in the barriers which self-heal in subsequent anneals.

Figure 6:
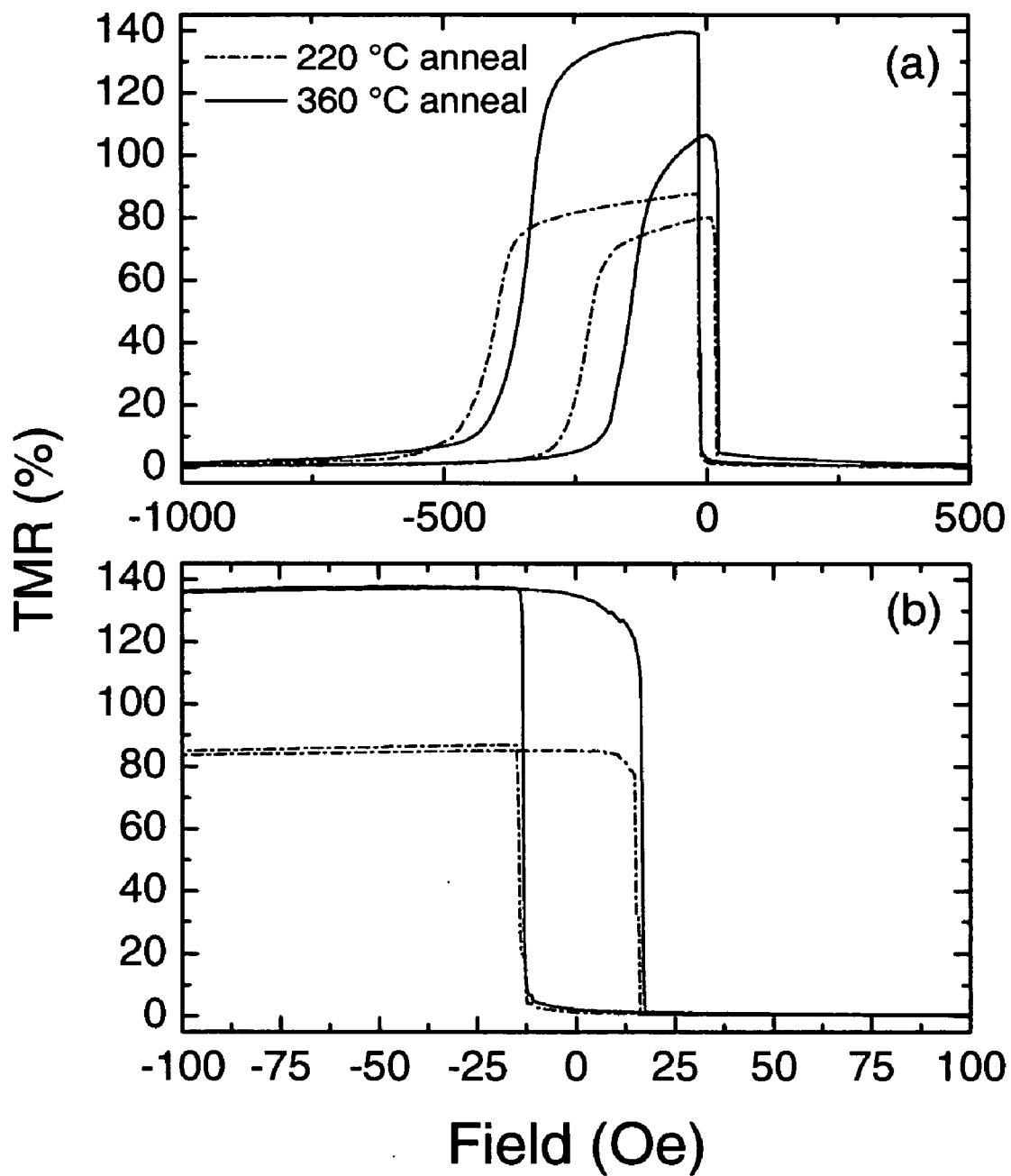
FIG. 6 illustrates how the tunneling magnetoresistance (measured at 25° C.) of a magnetic tunnel junction of the present invention varies as a function of magnetic field in the plane of the device, for final anneal treatments at 220° C. and 360° C.
Figure 7:
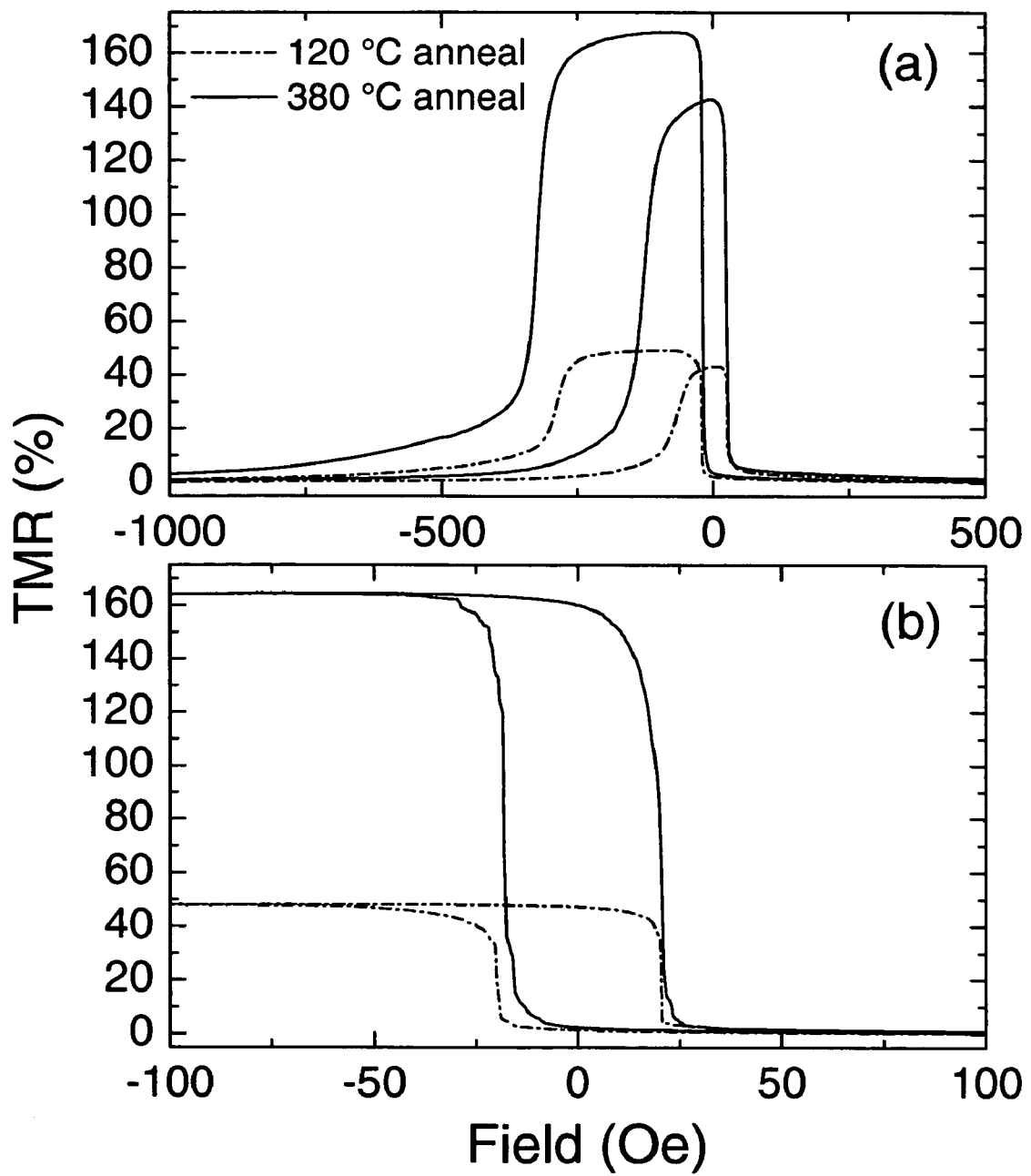
FIG. 7 illustrates how tunneling magnetoresistance (measured at 25° C.) of a magnetic tunnel junction of the present invention varies as a function of magnetic field in the plane of the device, for final anneal treatments at 120° C. and 380° C.

The maximum TMR values obtained after annealing for the data shown in FIGS. 4 and 5 are nearly 125%. By optimizing the structure, growth and annealing conditions TMR values of more than 160% are found at room temperature. In particular, by reducing the thickness of the Mg layer 122, slightly higher TMR values are observed. Resistance versus field curves for typical samples displaying TMR values of more than 140% and 160% are shown in FIGS. 6 and 7, respectively. These TMR values were obtained after annealing these samples to 360 and 380° C., respectively. The higher TMR value for the sample whose data is shown in FIG. 7 is most likely a result of the higher annealing temperature to which it could be subjected, whereas the sample of FIG. 6 degraded significantly when it was annealed above 360° C. Thus, there is some variation from sample to sample in thermal stability. This is most likely because these data are taken on MTJ samples prepared using shadow masks which means that the edges of the samples are exposed to air when removed from the sputter deposition system and during the annealing studies. Since the time between the deposition of these samples and the time when the annealing studies were carried out differs from sample to sample, there is the possibility of different exposures of the edges of the layers in the various MTJs to air and, in particular, to water in the air. MgO is hygroscopic and easily degrades in the presence of water to form a hydroxide which is much less thermally stable. In actual devices the MTJ and the MgO are likely encapsulated by an oxide or other protective material.

Figure 8:
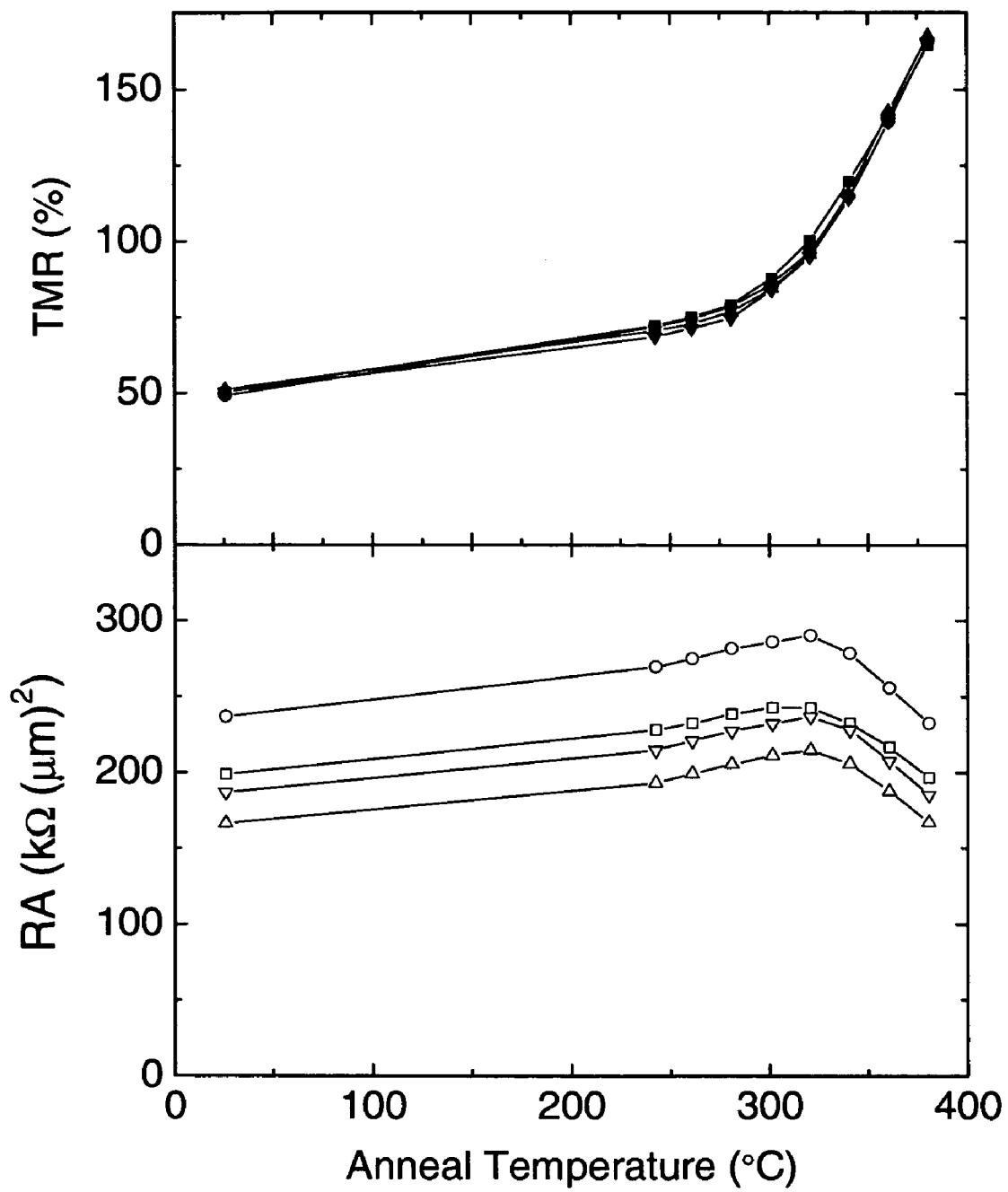
FIG. 8 illustrates how tunneling magnetoresistance and resistance-area product (measured at 25° C.) for three magnetic tunnel junction devices of the present invention vary as a function of annealing temperature.

The two samples corresponding to the data in FIGS. 6 and 7 have very similar structures with the exception of slightly different MgO barrier thicknesses. In particular, the layers 112 are formed from 100 Å TaN, in which the Ta was formed by reactive sputtering of Ta in an Ar-2% $N_2$ sputter gas mixture. The nitrogen content was deliberately chosen to be less than the $N_2$ content required to obtain stoichiometric TaN, because N deficient TaN layers can improve the (100) texture of fcc layers grown on top of them. The antiferromagnetic layer 116 was formed from 250 Å $Ir_{25}Mn_{75}$ and the pinned ferromagnetic layer was formed from a bilayer of 8 Å $Co_{84}Fe_{16}$ (layer 118) and 30 Å $Co_{70}Fe_{30}$ (layer 119). The barrier was formed by first depositing a layer of Mg ~5 Å thick (layer 122), followed by a MgO layer (layer 124) formed by reactive sputtering of Mg in an Argon-3% $O_2$ gas mixture. In FIG. 6 the barrier was formed from an MgO layer (124) ~24 Å thick, whereas in FIG. 7 the MgO layer (124) was ~20 Å thick. The resistance-area (RA) product for the sample with the thicker MgO layer ~64 M$\Omega(\mu m)^2$ was correspondingly significantly higher, whereas the RA product for the sample with the thinner MgO layer ~200 k$\Omega(\mu m)^2$ was much lower. Extensive studies were carried out to measure the RA versus Mg layer and MgO thickness. The RA product increases approximately exponentially with the thickness of the MgO tunnel barrier. Notwithstanding the considerable difference in RA values of the two samples of FIGS. 6 and 7, the TMR values and the variation of TMR on annealing is very similar. The detailed dependence of TMR on anneal temperature (for the sample whose resistance versus field curves are shown in FIG. 7) is shown in FIG. 8. The free ferromagnetic layer 134 was formed from 150 Å $Co_{84}Fe_{16}$ in both cases, but the capping layer 136 was formed from 125 Å TaN for the sample with the thicker MgO barrier (FIG. 6) and from 100 Å Mg for the sample with the thinner MgO barrier (FIG. 7). The TaN layer for the capping layer was formed by reactive sputtering of Ta in an Argon-10% $N_2$ mixture, which gives rise to a nearly stoichiometric TaN compound. Studies suggest that such a capping layer has higher thermal stability than layers with lower $N_2$ content.

As shown in FIG. 8, whereas the TMR significantly increases with anneal temperature, the resistance of the MTJ measured when the magnetic moments of the free and pinned ferromagnetic layers are parallel ($R_P$) is comparatively insensitive to anneal temperature, varying by no more than ~30%. The detailed dependence of $R_P$ on anneal temperature is sensitive to the Mg layer thickness, in particular, but is also sensitive to details of the MTJ structure and composition.

Figure 9:
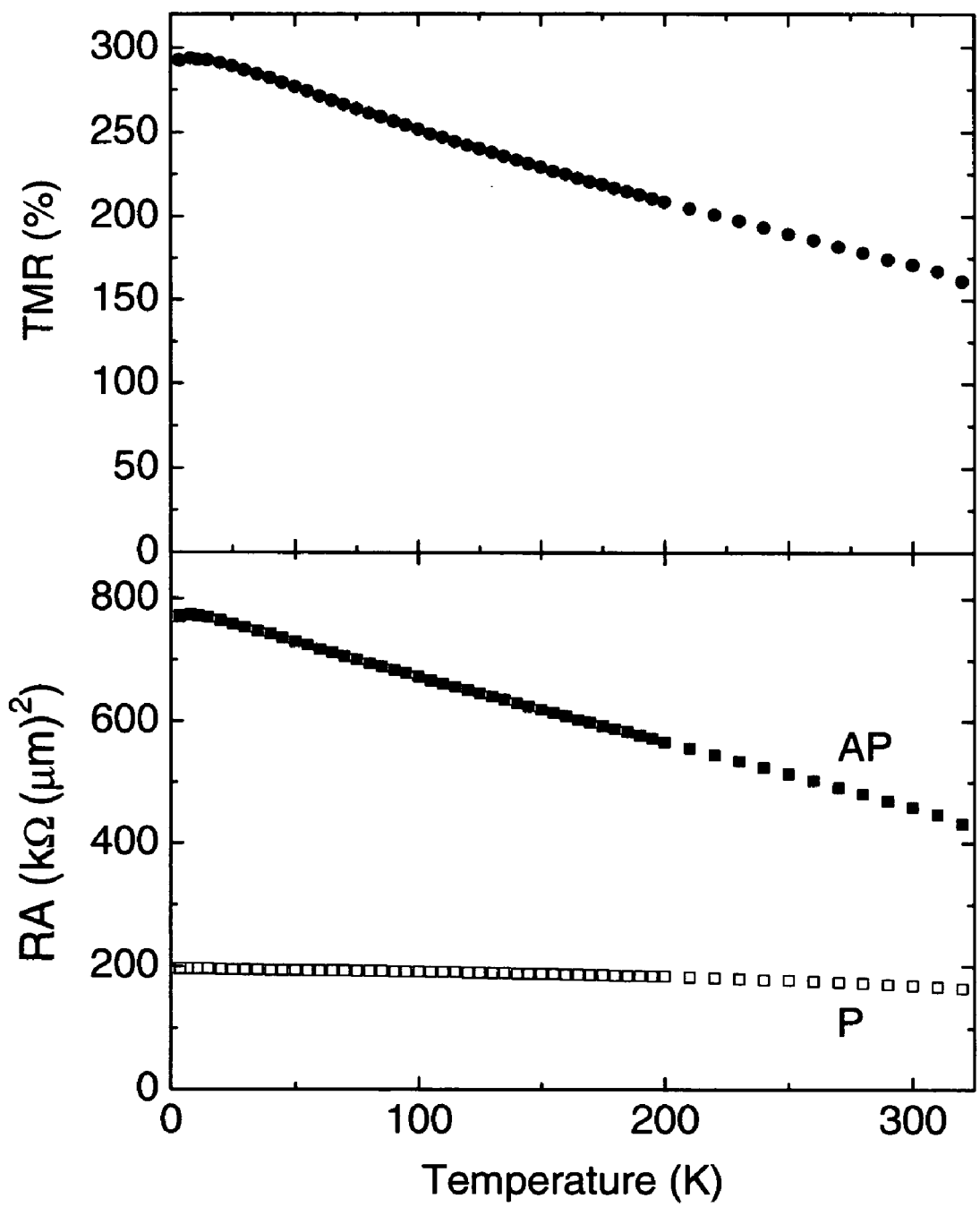
FIG. 9 illustrates how tunneling magnetoresistance and resistance-area product of a magnetic tunnel junction device of the present invention vary as a function of measurement temperature, for both the parallel (P) and anti-parallel (AP) orientation of the ferromagnetic layers.

FIG. 9 shows the variation of TMR and resistance-area product with temperature, for temperatures between 325K and 4K, for both the parallel ($R_P$) and anti-parallel ($R_{AP}$) orientations of the free and pinned ferromagnetic layers (for the same sample for which data is shown in FIGS. 7 and 8). As shown in FIG. 9, the TMR increases significantly as the temperature is lowered and almost doubles on cooling from 300K to 4K. Over the same temperature range, the resistance for the parallel state hardly changes at all, but the resistance in the anti-parallel state increases substantially. It is the increase in $R_{AP}$ that largely accounts for the increase in TMR as the temperature is reduced. For similar MTJs with prior art $Al_2O_3$ tunnel barriers, the TMR increases by a factor of about 1.5 over the same temperature range. The increase in TMR is usually attributed to the temperature dependence of the interface magnetization, which is likely to be stronger than that of the bulk magnetization. The larger fractional increase in TMR for MTJs with MgO compared to prior art $Al_2O_3$ tunnel barriers may suggest that the interface magnetization has a stronger temperature dependence for MgO barriers. If this is the case, this would suggest that improved ferromagnetic/MgO interfaces would lead to even higher TMR values at room temperature. It is also possible that the strong temperature dependence of TMR could be attributed to defects in the tunnel barrier which might lead to relaxation of the spin of the tunneling electrons and so to diminished TMR. At lower temperatures, these defect mediated tunneling channels are likely to become less probable which could account for the increased TMR. Finally, the degree of AP alignment of the pinned and free ferromagnetic layer moments also will strongly influence the magnitude of the TMR. The resistance versus field curves do show, as expected, that the exchange bias field does increase significantly as the temperature is reduced from 300 to 4K. Thus a greater degree of AP coupling could also account for the increased TMR values at lower temperatures.

The magnitude of the TMR is most sensitive to the nature of the layer 112. It seems very clear that the layer or layers 112 are preferably chosen so that the IrMn layer and the ferromagnetic pinned layers grow textured in the (100) orientation and that the ferromagnetic layer is preferably formed in the bcc crystal structure. High TMR values (compared to those possible with prior art $Al_2O_3$ tunnel barriers) are found for $Co_{1-x}Fe_x$ alloys with more than about 8 atomic % Fe or for pure Fe underlayers. Ni—Fe alloys which are fcc (e.g. for permalloy, $Ni_{81}Fe_{19}$) give TMR values no higher than those found for prior art $Al_2O_3$ tunnel barriers. The method for forming MgO tunnel barriers described herein can be used for a wide variety of ferromagnetic underlayers and capping layers, with TMR values typically at least as high as those found for prior art $Al_2O_3$ tunnel barriers for otherwise the same structures. However, significantly enhanced TMR values compared to those for prior art $Al_2O_3$ tunnel barriers are found only when the texture of the ferromagnetic layer 119 and that of the MgO tunnel barrier 120' is predominantly (100). There are a wide variety of layers which give rise to (100) texture, and many of these can be used with the method of formation of the MgO tunnel barrier described herein for forming MTJs with increased TMR compared to comparable MTJs with prior art $Al_2O_3$ barriers.

The preferred temperature for annealing MTJs with MgO tunnel barriers formed as described herein depends on the required TMR. The highest TMR values are found for annealing temperatures in the range from 180 to 400° C., with generally higher TMR values, the higher the anneal temperature. For temperatures significantly higher than 400° C., the resistance of the MTJs and the TMR typically decreases. Depending on the application and the environment of the MTJ, the maximum anneal temperature to which the MTJ may be subjected may be limited by other components of the device in which the MTJ forms a part. For applications in magnetic tunnel junction memory elements for use as magnetic random access memories (see, for example, U.S. Pat. No. 6,226,160), the back end of line processing environment may need to withstand temperatures of between 250 and 400° C. The high thermal stability of MTJs described herein makes MTJs with MgO barriers formed as described herein very attractive. For applications as the reading element in magnetic recording heads, the maximum temperature to which the recording head can be subjected during processing may be limited by components of the head other than the MgO tunnel junction read sensor. Thus, it may be preferable to subject the MgO tunnel junction device to an anneal treatment at a preferred temperature after it is formed prior to fabricating other components of the recording head at lower temperatures.

The method of deposition described herein is for deposition at nominally room temperature. However, any of the layer 112, the antiferromagnetic biasing layer 116, the lower ferromagnetic electrode 118 and 119 (if present), the Mg layer 122 and the MgO tunnel barrier 124 may be deposited at elevated temperatures for improving the crystallographic texture of the ferromagnetic layer 119 and the MgO tunnel barrier 120', for the purpose of increasing the TMR magnitude. Preferred deposition temperatures will depend on the detailed structure and composition of these layers. Thermal annealing may also improve the crystallographic texture of the MgO layer 120' and the surrounding layers, so that the structure prior to annealing may not be substantially (100) oriented but after thermal anneal treatments in the temperature range described above the crystallographic texture becomes substantially (100) oriented.

The MgO layer 124 may be formed by various deposition methods in addition to reactive sputter deposition. Any method which delivers both Mg and oxygen in a sufficiently reactive state to form MgO during the deposition of the Mg and oxygen is suitable. For example, the Mg can be deposited by ion beam sputtering from a Mg target in the presence of oxygen generated from a source of atomic oxygen such as an rf or microwave source. Similarly, the MgO can be deposited by ion beam sputtering from a Mg target in the presence of reactive oxygen delivered from an ion-assist source. The MgO layer 124 can also be evaporated from a source of MgO, for example, by electron beam evaporation using a beam neutralizer, or by evaporation from a crucible or from a Knudsen source. The MgO layer 124 can also be formed by deposition from a MgO source in the presence of atomic oxygen provided by an rf or microwave source or any other source of sufficiently reactive oxygen. The MgO layer can also formed by pulsed laser deposition either by using a MgO target or a Mg target in the presence of sufficiently reactive oxygen. The MgO layer may also be formed by reactive sputtering from a Mg target using various sputtering gas mixtures, provided that oxygen is present. For example, Argon can be replaced by other rare gases, for example, Neon or Krypton or Xenon. The Mg in the underlayer 122 and the MgO layer 124 is ideally free of impurities; the Mg preferably contains less than 5 atomic % of impurities, and more preferably less than 1 atomic % of impurities, so as to not substantially affect the tunneling properties of the MgO tunnel barrier, which would, for example, affect the TMR values of the corresponding magnetic tunnel junction.

The ferromagnetic layers herein (such as layers 115, 118, 119, and 134) can be formed from any ferromagnetic or ferrimagnetic metal or indeed any ferromagnetic or ferrimagnetic material which is sufficiently conducting. In particular, these layers can be formed from ferrimagnetic metals such as $Fe_3O_4$, or from metallic ferromagnetic oxides such as oxides from the perovskite family, including the family of ferromagnetic manganites such as $La_{1-x}Sr_xMnO_3$. Likewise, these layers can also be formed from various half-metallic ferromagnetic metals including $CrO_2$, the half-Heusler alloys such as NiMnSb and PtMnSb, and other ferromagnetic Heusler and half-Heusler alloys.

The structure illustrated in FIG. 2B contains an antiferromagnetic layer 116 but MTJs for memory or magnetic field sensing applications can be formed without the layer 116. The moment of the lower ferromagnetic electrode can be fixed by a variety of methods including the use of magnetically hard ferromagnetic materials such as described in U.S. Pat. No. 5,936,293 to Parkin. It is also clear that the exchange biased ferromagnetic electrode can be formed on top of the MgO barrier 120' with the free ferromagnetic layer below the MgO barrier.

It may also be preferred to form one or both of the ferromagnetic electrodes 119 and 134 from sandwiches of two antiferromagnetically coupled ferromagnetic layers for the purposes of reducing the stray magnetostatic fields from the edges of the ferromagnetic electrodes. As described in U.S. Pat. Nos. 5,465,185 to Parkin et al. and 6,153,320 to Parkin, this can be accomplished by forming the electrodes 115 and 134 from sandwiches of two thin ferromagnetic layers separated by thin layers of Ru or Os or an alloy of Ru and Os, in which each of these thin ferromagnetic layers can be formed from a multiplicity of ferromagnetic layers.

Extensive studies were carried out to explore the dependence of TMR on the thickness of the MgO tunnel barrier 120'. High TMR well above 100% was found for a wide range of MgO barrier thicknesses corresponding to RA values ranging from below ~$80\Omega(\mu m)^2$ to more than $10^9\Omega(\mu m)^2$. Studies were carried out to determine the lowest possible RA values. The smallest RA values were obtained by depositing the thinnest possible Mg layers 122 and the thinnest possible MgO layers 124. RA values as low as ~$1\Omega(\mu m)^2$ were obtained for Mg layers in the range of 4 to 5 Å and for MgO layers 124 in the range of 1-4 Å. However, for these ultra-low RA values, reduced TMR was observed with TMR values in the range of 25 to 30%. As described in U.S. Pat. No. 6,359, 289 to Parkin, magnetic tunnel junction based recording read heads for future generation ultra high density magnetic recording disk drives require extremely low RA tunnel barriers with reasonable TMR values. The method of preparing MgO tunnel barriers 120' described herein may be useful for such applications.

The TMR values of the MTJ devices incorporating Mg oxide tunnel barriers have been found to depend on the Mg oxide tunnel barrier thickness, thermal treatments of the devices, which can be used to enhance the TMR values, as well as details of the deposition process, especially the amount of reactive oxygen used to form the Mg oxide layers. The TMR values also are dependent on the structure of the Mg oxide barrier. The theoretical arguments that suggested improved TMR values in MTJ devices incorporating MgO barriers and Fe electrodes for (100) oriented epitaxially grown devices assume perfectly formed barriers and interfaces with the ferromagnetic electrodes. Other theoretical work has strongly suggested that even small amounts of disorder would render these theoretical predictions moot and, indeed, have been used to explain why other groups have not been able to find TMR values for MgO barriers which are higher than those obtained for more conventional tunnel barriers such as $Al_2O_3$. For example, E. Y. Tsymbal and D. G. Pettifer (Phys. Rev. B 58, 432 (1998)) theorize that disorder in a tunnel barrier leads to a considerable reduction in TMR of MTJs. Similarly, Zwierzycki et al. (Phys. Rev. B 67 092401 (2003)) find that symmetry breaking resulting from disorder at an Fe/InAs interface leads to significantly lower values of the spin polarization of injected current than would otherwise be the case without disorder. The same symmetry arguments should apply to MTJs with MgO tunnel barriers. Thus, it is quite surprising that the TMR values reported herein for MTJs using MgO tunnel barriers are so high even with the disclosed method of forming these barriers. In the present work, it has been found that crystallographic orientations of MgO other than (100) give much lower TMR values comparable to that of amorphous $Al_2O_3$ tunnel barriers. If the MgO barrier includes a mixture of (100) grains and grains of other orientations, then the TMR will be, to a first approximation, locally enhanced to the extent that (100) grains are present, provided that the grains extend across the entire thickness of the MgO barrier and the neighboring magnetic layers.

It is also surprising, based on the prior art, that the thermal anneal treatments disclosed herein, which are used to obtain high TMR in MgO based MTJs, do not result in significant degradation of the TMR of the MTJs. In the prior art there are numerous studies which suggest that Mn diffusion from antiferromagnetic exchange bias layers formed from Mn alloys, especially IrMn alloys, results in degradation of TMR at temperatures above 300° C., as discussed, for example, by Cardoso et al. ("Spin-tunnel-junction thermal stability and interface interdiffusion above 300 "C", *Appl. Phys. Lett.* 76, 610 (2000)). Similarly, there are extensive reports of Mn diffusion induced by thermal anneal treatments at temperatures as low as 250 to 300° C. from Mn-containing exchange bias layers in spin-valve structures, as discussed, for example, for PtMn based spin valves by Takiguchi et al. ("A. Thermal degradation of spin valve multilayers caused by Mn migration", *J. Appl. Phys.* 87, 2469 (2000)) and Kim et al. ("Magnetoresistance and interlayer diffusion in PtMn spin valves upon postdeposition annealing", *J. Appl. Phys.* 89, 6907 (2001)), and in CrMn exchange biased spin valves by Xi et al. ("Annealing effect on exchange bias in Ni81Fe19/Cr50Mn50 bilayers", *IEEE Trans. Magn.* 36, 2644 (2000)). Degradation of giant magnetoresistance in spin-valve exchange biased structures due to thermal treatments at temperatures of 330° C. are discussed by Aoshima et al. ("Thermal deterioration mechanism of CoFeB/PdPtMn spin valves", *J. Appl. Phys.* 85, 5042 (1999)) for PdPtMn exchange bias layers. Cardoso et al. ("High thermal stability tunnel junctions", *J. Appl. Phys.* 87, 6058 (2000)) describe IrMn exchange biased magnetic tunnel junctions with alumina tunnel barriers which exhibit 40% TMR values after annealing at 300° C., but only 15% TMR after annealing at 380° C. These authors describe these MTJs as being highly thermally stable, even through they demonstrate a loss of nearly 70% of their TMR after annealing at 380° C. Similarly, the same group observes degradation of TMR at temperatures as low as 250° C. for tunnel junctions formed using AlN tunnel barriers. Likewise, Hibino observes a reduction in the TMR when his $Al_2O_3$ tunnel barriers are subjected to a temperature of 280° C. (see US 2002/0076940A1, published Jun. 20, 2002).

The aforementioned prior art (in the preceding two paragraphs) on exchange biased spin valves devices and exchange biased MTJs with alumina and AlN tunnel barriers suggests that anneal treatments at temperatures above 250 to 300° C. causes severe loss of giant or tunneling magnetoresistance. Thus it is quite unanticipated that the method of formation of the MgO tunnel barriers described herein using anneal treatments at temperatures ranging from 250 to 400° C. should give rise to improved TMR values without any significant degradation of the tunnel junction resistance. Note that it is not unexpected that the tunnel resistance values would be reduced by a factor of two or more on annealing, even if the barrier structure and morphology is not significantly changed by the anneal treatments, since the resistance of the tunnel junction is exponentially dependent on the barrier thickness. Thus, even slight changes in the thickness or effective thickness of the barrier, such as could be caused by small changes in the density of the barrier or slight motions or restructuring of the atoms within or at the interfaces of the tunnel barrier on annealing, might result in changes in the resistance of the barrier, even though the TMR might be unchanged or change proportionally less.

In order to establish exchange bias of the pinned ferromagnetic layer with the antiferromagnetic material, which is here preferably IrMn, the antiferromagnetic/pinned ferromagnetic layer sandwich must be heated above the blocking temperature of the antiferromagnet. The sandwich must only be heated above the blocking temperature for a very brief amount of time long enough for the antiferromagnetic domains in the antiferromagnetic material to reorient themselves with the magnetic moment of the pinned ferromagnetic layer. The moment of the pinned ferromagnetic layer is maintained in the preferred direction of exchange bias by orienting the ferromagnetic layer magnetic moment with an external magnetic field. The magnitude of this magnetic field is chosen to align, as fully as possible, the ferromagnetic layer moment along this field. The moment may not be fully aligned, for example, if the orienting field does not have a large enough strength. When the sandwich is cooled below the blocking temperature of the antiferromagnet, then there is a preferred direction of alignment of the domains in the antiferromagnet, which establishes the exchange bias field. Thus, an MTJ, in which the reference ferromagnetic layer direction is set by an exchange bias field from an antiferromagnetic layer, is usually heated in a magnetic field to a temperature above the blocking temperature of the antiferromagnetic exchange bias layer for a short period of time. This period of time is usually chosen to be as short as possible since the antiferromagnetic domains will align themselves within a very short period of time (much less than the shortest possible time which can be achieved with typical heating furnaces), and since the properties of prior-art MTJs usually decay when heated above even moderate temperatures. The annealing procedures described herein thus involve much longer times and/or higher temperatures than would be used in the prior art for the purposes of setting an exchange bias field.

Figure 10A:
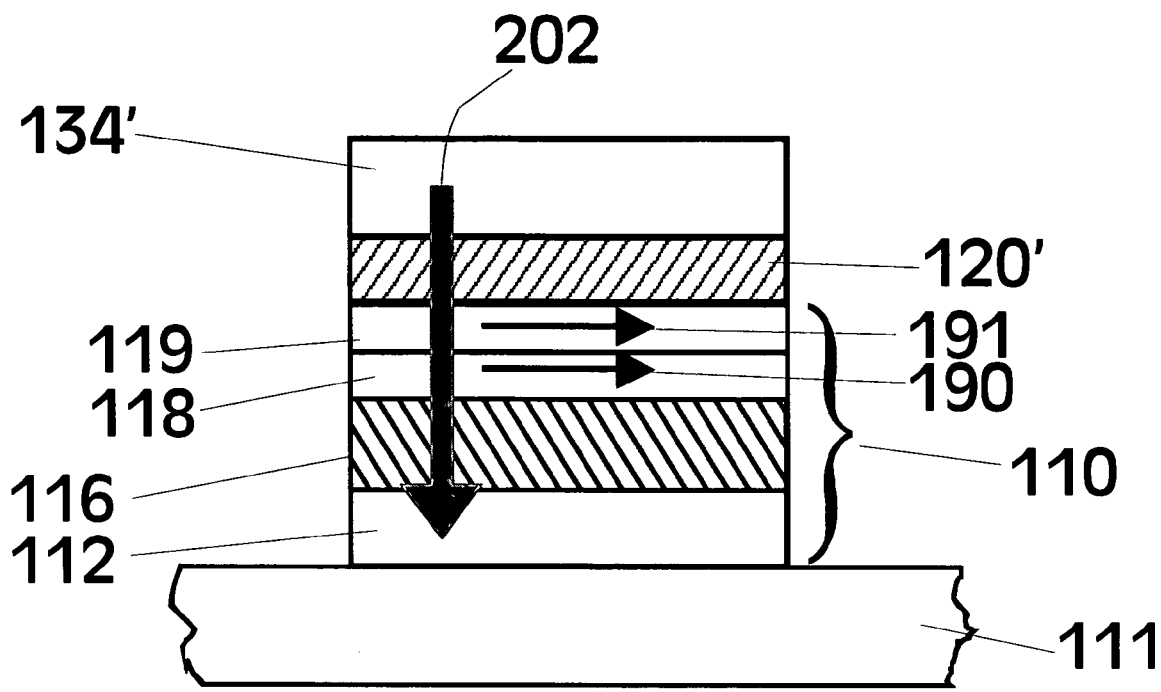
FIGS. 10A, 10B, and 10C are cross sectional views of alternative tunnel junction devices of the present invention that employ MgO tunnel barriers.
Figure 10B:
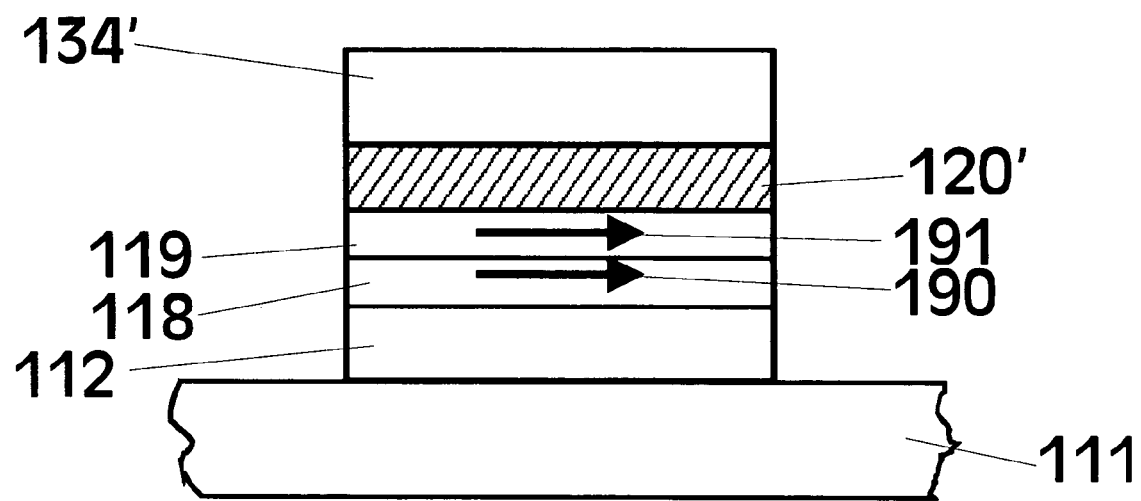

The method of producing high quality MgO tunnel barriers without oxidizing the underlayer has been described particularly with reference to the use of such barriers in magnetic tunnel junctions. The method of preparing MgO tunnel barriers described herein can be applied to a wide variety of tunnel junction devices in which one or the other or both of the metal layers on either side of the MgO tunnel barrier do not need to be ferromagnetic. Illustrations of such structures are shown in FIG. 10. FIG. 10A shows a tunnel junction device in which the upper electrode is formed from a non-magnetic metal layer 134' adjacent to the MgO tunnel barrier 120'. The lower electrode is formed from an exchange biased ferromagnetic layer. The tunneling current is passed through the device as shown by the arrow 202 and is spin polarized by the ferromagnetic layer 119. FIG. 10B illustrates a similar device in which the lower ferromagnetic electrode is formed without the antiferromagnetic exchange bias layer. Such a structure may be useful as part of a magnetic tunnel transistor (MTT). The MTT is a three terminal device typically formed from a magnetic tunnel junction married to a semiconductor collector where the semiconductor can be formed from, for example, GaAs or Si. The MgO tunnel barriers described herein may be grown directly on GaAs or on underlayers that include GaAs. One ferromagnetic electrode in the MTJ forms the emitter, and the other ferromagnetic layer forms the base of the three terminal device between the tunnel barrier of the MTJ and the semiconducting collector. The MTJ component of the MTT could be formed as described herein with a MgO tunnel barrier. However, it may also be advantageous for certain applications that the emitter of the magnetic tunnel transistor be formed from a non-magnetic metal according to the structure shown in FIG. 10B.

Figure 10C:
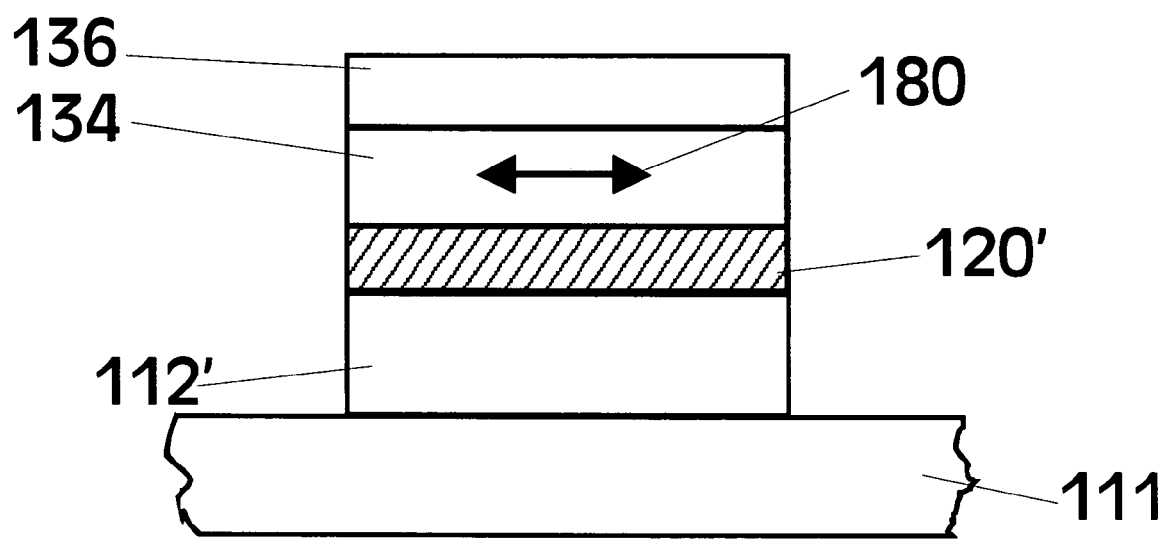

FIG. 10C illustrates a tunnel junction device where the lower electrode is formed from a non-magnetic metal layer 112'. This layer may be formed from more than one metal layers including the possibility that the layer 112' may contain ferromagnetic layers not immediately adjacent to the MgO tunnel barrier 120'. Again this type of structure may be useful as part of a MTT where the emitter of the MTT is ferromagnetic but the base layer is non-magnetic.

For the structures illustrated in FIGS. 10A, B and C, in which there is only one ferromagnetic electrode, the current from the ferromagnetic electrode will nevertheless be spin-polarized. The magnitude of the spin polarization of the tunneling current can be measured using the superconducting tunneling spectroscopy technique by replacing the non-magnetic metal electrode 134' or 112' with a superconducting electrode such as Al or Si or Cu doped Al. The polarization of the tunneling current can be inferred from conductance versus bias voltage curves measured at very low temperatures (0.25K), well below the superconducting order temperature of the Al layer, and in the presence of large magnetic fields (in the range of 2 Tesla) applied in the plane of the superconducting electrode. The magnetic field Zeeman splits the quasi-particle density of states in the superconductor providing for spin polarized states into which the electrons tunnel. By fitting the conductance versus bias voltage curves the spin polarization of the tunneling electrons can be inferred with high precision. This method was originally developed by Merservey and Tedrow (Physics Reports 238, 173 (1994)) and has been extensively used to study the spin polarization of tunneling electrons in magnetic tunneling junctions with $Al_2O_3$ tunnel barriers. Spin polarization values are typically no higher than ~40 to 50%. By contrast, values of spin polarization measured using the STS method for MgO junctions prepared according to the methods described herein are significantly higher and exceed 76% (e.g., up to 85%). Thus the structures illustrated in FIGS. 10A, B and C can be prepared with very high quality MgO tunnel barriers and extremely high values of spin polarized electrical current.

Figure 10D:
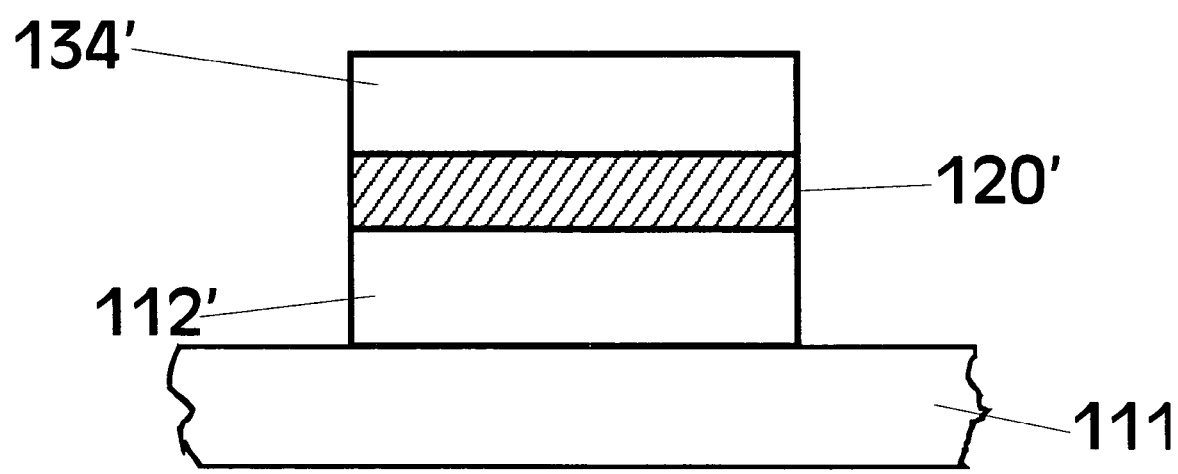
FIG. 10D is a cross sectional view of a metal/insulator/metal device of the present invention that employs a MgO tunnel barrier.

FIG. 10D shows an example of a metal-insulator-metal (MIM) tunnel junction device. As illustrated in FIG. 10D, the MIM structure contains no ferromagnetic metals on either side of the tunnel barrier. The electrodes 112' and 134' may be formed from one or more metal layers. MIM structures have many applications, for example, capacitors for storing charge or as non-linear elements in electrical circuits. MIM devices may be used as voltage controlled switches if they are sufficiently non-linear. For example, at low voltage the resistance is high but at higher voltages the resistance is substantially reduced because of the non-linear characteristics of the tunnel barrier. The metal layers 112' and 134' can be formed from metals such as Cu, Al, W, W—Ti, $RuO_2$ or $IrO_2$ or Ir, Pt or Pd, as well as TaN, Ta, TiN or Ti. The structure illustrated in FIG. 10D may also be useful for superconducting devices in which one or both of the electrodes 112' and 134' may be formed from superconducting layers. For example, one or both of these layers could be formed from Nb or NbN.

Figure 11:
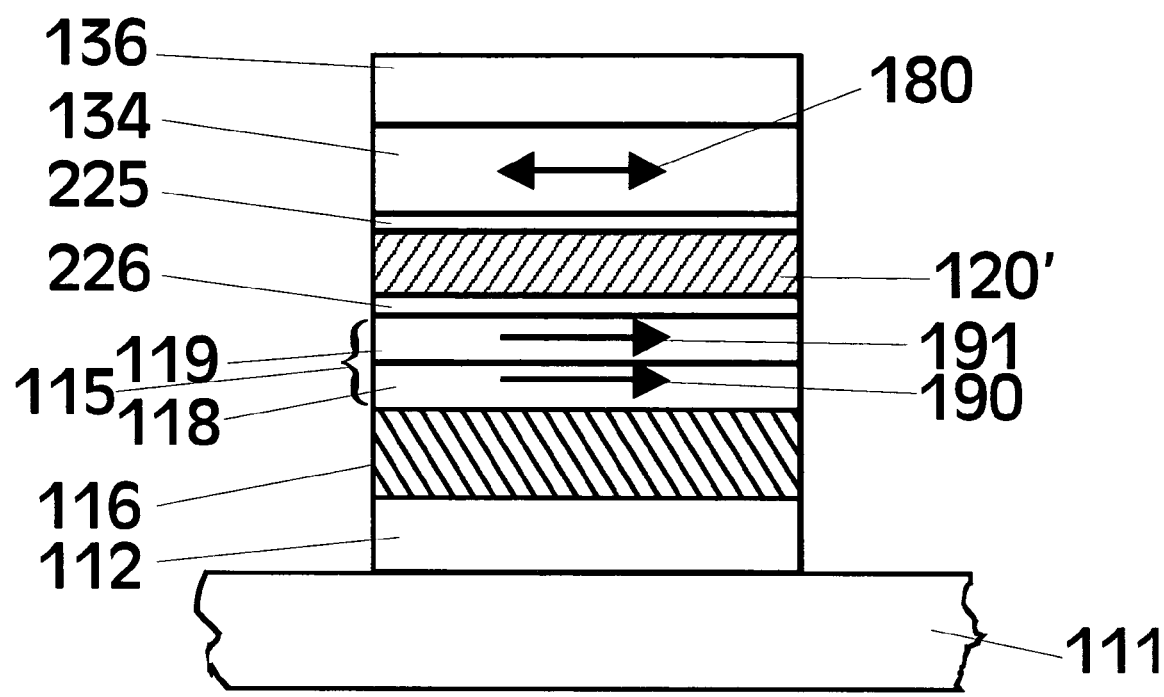
FIG. 11 is a cross sectional view of a magnetic tunnel junction device of the present invention that employs spacer layers.

While the ferromagnetic layer is preferably in direct contact with the MgO tunnel barrier 120', it is also possible to separate the ferromagnetic electrode and the tunnel barrier by a thin spacer layer, providing that the spacer layer does not significantly diminish the spin polarization of the electrons tunneling through the tunnel barrier 120'. FIG. 11 illustrates a thin spacer layer 225 between the tunnel barrier 120' and the free ferromagnetic layer 134 in the magnetic tunnel junction device of FIG. 2B. As described in U.S. Pat. No. 5,764,567 to Parkin with reference to magnetic tunnel junction devices formed with alumina tunnel barriers, the ferromagnetic electrodes in such MTJs can be separated from the tunnel barrier by thin spacer layers formed from Cu and other non-magnetic metallic materials while maintaining significant tunneling magnetoresistance. The types of non-magnetic metallic materials which are preferred are those which display large values of giant magnetoresistance in metallic spin-valve structures or in metallic magnetic multilayers. These include Ag and Au as well as Cu. The non-magnetic spacer layer could also be formed from a metallic oxide layer such as $RuO_2$ or a Sr—Ru oxide. As illustrated in FIG. 11, the free ferromagnetic layer 134 and the spacer layer 225 comprise an overlayer. Generally, the magnetic tunnel junction will include an overlayer formed on top of the MgO tunnel barrier 120' which may be comprised of one or more ferromagnetic layers with or without a non-magnetic spacer layer, or, more generally, from a multiplicity of ferromagnetic and non-ferromagnetic, non-ferrimagnetic layers. Similarly, the magnetic tunnel junction will include an underlayer beneath the MgO tunnel barrier 120' which may be comprised of one or more ferromagnetic layers with or without a non-magnetic spacer layer (e.g., spacer layer 226), or, more generally, from a multiplicity of ferromagnetic and non-ferromagnetic, non-ferrimagnetic layers.

While the method of forming an improved MgO tunnel barrier has been described with respect to the formation of MgO barriers on polycrystalline underlayers, the method can also be used for the formation of improved MgO tunnel barriers on crystalline underlayers prepared on crystalline substrates such as various facets of MgO or sapphire single crystals.

While the present invention has been particularly shown and described with reference to the preferred embodiments, it will be understood by those skilled in the art that various changes in form and detail may be made without departing from the spirit and scope of the invention. Accordingly, the disclosed invention is to be considered merely as illustrative and limited in scope only as specified in the appended claims.

What is claimed is:

1. A structure, comprising:
   a first layer that includes magnetic material selected from the group consisting of ferromagnetic materials and ferrimagnetic materials;
   a MgO tunnel barrier; and
   a second layer that includes magnetic material selected from the group consisting of ferromagnetic materials and ferrimagnetic materials, wherein the first layer, the MgO tunnel barrier, and the second layer are in proximity with each other and form a magnetic tunnel junction, and wherein i) the amount of any oxide between the MgO tunnel barrier and the first layer and any oxide between the MgO tunnel barrier and the second layer is sufficiently low, and ii) the MgO tunnel barrier, the first layer, and the second layer are sufficiently free of defects, that the tunnel magnetoresistance of the magnetic tunnel junction is greater than 100% at room temperature.

2. The structure of claim 1, wherein at least one of the first layer and the second layer includes a spacer layer that is in contact with the MgO tunnel barrier, wherein the spacer layer does not substantially interfere with the tunneling properties of the MgO tunnel barrier.

3. The structure of claim 1, wherein the MgO tunnel barrier has a thickness of between 3 and 50 angstroms.

4. The structure of claim 1, wherein the MgO tunnel barrier has a thickness of between 4 and 15 angstroms.

5. The structure of claim 1, wherein at least one of the first layer and the second layer includes ferromagnetic material.

6. The structure of claim 1, wherein the tunnel magnetoresistance of the magnetic tunnel junction is greater than 140% at room temperature.

7. The structure of claim 1, wherein the tunnel magnetoresistance of the magnetic tunnel junction is greater than 160% at room temperature.

8. The structure of claim 1, wherein at least one of the first layer and the second layer includes antiferromagnetic material that is exchange biased with the magnetic material of said at least one layer, the antiferromagnetic material including at least one alloy selected from the group consisting of Ir—Mn and Pt—Mn, in which the alloy is substantially (100) oriented and is either fcc or slightly distorted fcc.

9. The structure of claim 1, wherein the second layer includes antiferromagnetic material and at least one material selected from the group consisting of Ta and TaN.

10. The structure of claim 1, wherein the MgO tunnel barrier is in direct contact with magnetic material of the first layer and is in direct contact with magnetic material of the second layer.

11. The structure of claim 1, wherein the first layer and the second layer each include magnetic material that is bcc and substantially (100) oriented.

12. The structure of claim 11, wherein the MgO tunnel barrier is (100) oriented.

13. The structure of claim 1, wherein at least one of the first layer and the second layer includes magnetic material that is bcc and substantially (100) oriented.

14. The structure of claim 13, wherein the MgO tunnel barrier is (100) oriented.

15. The structure of claim 1, wherein the MgO tunnel barrier includes polycrystalline grains.

16. The structure of claim 1, wherein each of the layers includes an alloy of Fe and Co, and the Fe content of the alloy is between 1 and 99 atomic %.

17. The structure of claim 1, wherein the tunnel junction has been annealed at a temperature greater than 200° C. to increase the tunnel magnetoresistance of the tunnel junction.

18. The structure of claim 1, wherein the tunnel junction has been annealed at a temperature greater than 350° C. to increase the tunnel magnetoresistance of the tunnel junction.

19. A structure, comprising:
a first ferromagnetic layer;
a second ferromagnetic layer; and
a MgO tunnel barrier between the first and second ferromagnetic layers,
wherein the first ferromagnetic layer, the MgO tunnel barrier, and the second ferromagnetic layer form a magnetic tunnel junction, and wherein the amount of any oxide between the MgO tunnel barrier and the first layer and any oxide between the MgO tunnel barrier and the second layer is sufficiently low that the magnetic tunnel junction has a tunnel magnetoresistance of greater than 100% at room temperature.

20. The structure of claim 19, wherein the tunnel magnetoresistance of the magnetic tunnel junction is greater than 120% at room temperature.

21. The structure of claim 20, wherein the MgO tunnel barrier has a thickness of between 3 and 50 angstroms.

22. The structure of claim 20, wherein the MgO tunnel barrier is in direct contact with ferromagnetic material of the first layer and is in direct contact with ferromagnetic material of the second layer.

23. The structure of claim 20, wherein the first layer and the second layer each include ferromagnetic material that is bcc and substantially (100) oriented.

24. The structure of claim 20, wherein the MgO tunnel barrier is (100) oriented.

25. The structure of claim 20, wherein the MgO tunnel barrier includes polycrystalline grains.

26. The structure of claim 20, wherein each of the layers includes an alloy of Fe and Co, and the Fe content of the alloy is between 1 and 99 atomic %.

27. The structure of claim 20, wherein the tunnel junction has been annealed at a temperature greater than 200° C. to increase the tunnel magnetoresistance of the tunnel junction.

28. The structure of claim 20, wherein the tunnel junction has been annealed at a temperature greater than 350° C. to increase the tunnel magnetoresistance of the tunnel junction.

29. The structure of claim 20, wherein the tunnel magnetoresistance of the magnetic tunnel junction is greater than 140% at room temperature.

30. The structure of claim 20, wherein the tunnel magnetoresistance of the magnetic tunnel junction is greater than 160% at room temperature.

31. A structure, comprising:
a first layer that includes ferromagnetic material;
a MgO tunnel barrier; and
a second layer that includes ferromagnetic material,
wherein the first layer, the MgO tunnel barrier, and the second layer are in proximity with each other and form a magnetic tunnel junction that is sufficiently free of defects and deleterious oxide, that the magnetic tunnel junction has a tunnel magnetoresistance of greater than 100% at room temperature.

32. The structure of claim 31, wherein the magnetic tunnel junction is sufficiently free of defects and deleterious oxide, that the magnetic tunnel junction has a tunnel magnetoresistance of greater than 140% at room temperature.

33. The structure of claim 31, wherein the magnetic tunnel junction is sufficiently free of defects and deleterious oxide, that the magnetic tunnel junction has a tunnel magnetoresistance of greater than 160% at room temperature.

34. The structure of claim 33, wherein the MgO tunnel barrier is in direct contact with ferromagnetic material of the first layer and is in direct contact with ferromagnetic material of the second layer.

35. The structure of claim 33, wherein the first layer and the second layer each include ferromagnetic material that is bcc and substantially (100) oriented.

36. The structure of claim 33, wherein the MgO tunnel barrier is (100) oriented.

37. The structure of claim 33, wherein the MgO tunnel barrier includes polycrystalline grains.

38. The structure of claim 33, wherein each of the layers includes an alloy of Fe and Co, and the Fe content of the alloy is between 1 and 99 atomic %.

39. The structure of claim 33, wherein the tunnel junction has been annealed at a temperature greater than 200° C. to increase the tunnel magnetoresistance of the tunnel junction.

40. The structure of claim 33, wherein the tunnel junction has been annealed at a temperature greater than 350° C. to increase the tunnel magnetoresistance of the tunnel junction.

41. The structure of claim 31, wherein the magnetic tunnel junction is sufficiently free of defects and deleterious oxide, that the magnetic tunnel junction has a tunnel magnetoresistance of greater than 120% at room temperature.

42. The structure of claim 41, wherein the MgO tunnel barrier has a thickness of between 3 and 50 angstroms.

\* \* \* \* \*